(12) United States Patent
Ebihara

(10) Patent No.: US 12,464,767 B2
(45) Date of Patent: Nov. 4, 2025

(54) SEMICONDUCTOR DEVICE AND POWER CONVERSION DEVICE

(71) Applicant: Mitsubishi Electric Corporation, Tokyo (JP)

(72) Inventor: Kohei Ebihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 308 days.

(21) Appl. No.: 18/031,365

(22) PCT Filed: Nov. 6, 2020

(86) PCT No.: PCT/JP2020/041487
§ 371 (c)(1),
(2) Date: Apr. 12, 2023

(87) PCT Pub. No.: WO2022/097262
PCT Pub. Date: May 12, 2022

(65) Prior Publication Data
US 2023/0378342 A1    Nov. 23, 2023

(51) Int. Cl.
*H10D 30/66* (2025.01)
*H10D 62/10* (2025.01)
*H10D 62/832* (2025.01)

(52) U.S. Cl.
CPC ......... *H10D 30/665* (2025.01); *H10D 62/106* (2025.01); *H10D 62/8325* (2025.01)

(58) Field of Classification Search
CPC ............. H10D 12/031; H10D 30/0291; H10D 30/665; H10D 62/105; H10D 62/106; H10D 62/8325; H10D 64/112
(Continued)

(56) References Cited

U.S. PATENT DOCUMENTS

2008/0227256 A1    9/2008  Tanimoto
2011/0284874 A1   11/2011  Miura et al.
(Continued)

FOREIGN PATENT DOCUMENTS

CN    102334190 A    1/2012
CN    102903702 A    1/2013
(Continued)

OTHER PUBLICATIONS

Japanese Office Action issued Nov. 7, 2023 in corresponding Japanese Patent Application No. 2022-560592 (with machine-generated English translation), 12 pages.
(Continued)

*Primary Examiner* — Fazli Erdem
(74) *Attorney, Agent, or Firm* — XSENSUS LLP

(57) ABSTRACT

In a semiconductor device, a semiconductor substrate is divided into an inner region in which an active region is provided and an outer region surrounding the inner region. The semiconductor device includes a semiconductor layer of a first conductivity type, a termination well region of a second conductivity type selectively provided in an upper layer portion of the semiconductor layer to surround the inner region, an impurity region selectively provided in an upper layer portion of the termination well region, a front surface electrode, a back surface electrode, an insulation film being provided to partially cover a top of the termination well region, an outer peripheral wire layer surrounding the inner region, at least a part of which is provided on the insulation film, and an interlayer insulation film at least covering the insulation film and the outer peripheral wire layer.

21 Claims, 32 Drawing Sheets

(58) Field of Classification Search
USPC .................................................... 257/329, 6
See application file for complete search history.

(56) References Cited

U.S. PATENT DOCUMENTS

| 2013/0026494 | A1 | 1/2013 | Oritsuki et al. |
| 2015/0295028 | A1 | 10/2015 | Kagata et al. |
| 2018/0151719 | A1 | 5/2018 | Sano et al. |
| 2019/0371936 | A1 | 12/2019 | Nagahisa et al. |
| 2020/0127144 | A1* | 4/2020 | Okuno ................. H10D 30/665 |
| 2021/0135002 | A1 | 5/2021 | Sugawara et al. |
| 2022/0149163 | A1* | 5/2022 | Ebihara ................ H10D 64/252 |

FOREIGN PATENT DOCUMENTS

| CN | 110431669 A | 11/2019 |
| DE | 102012219644 A1 | 6/2013 |
| DE | 112018001001 T5 | 11/2019 |
| JP | 2008-235331 A | 10/2008 |
| JP | 2013-26563 A | 2/2013 |
| WO | 2010/125661 A1 | 11/2010 |
| WO | 2014/087600 A1 | 6/2014 |
| WO | 2018038133 A1 | 3/2018 |
| WO | 2020/208761 A1 | 10/2020 |

OTHER PUBLICATIONS

International Search Report and Written Opinion mailed on Feb. 2, 2021, received for PCT Application PCT/JP2020/041487, filed on Nov. 6, 2020, 12 pages including English Translation.

Office Action issued Jan. 14, 2025 in Chinese Patent Application No. 202080106392.3, 13 pages.

Office Action issued Aug. 6, 2025 in corresponding German Application No. 112020007758.6 (19 pgs).

* cited by examiner

SEMICONDUCTOR DEVICE AND POWER CONVERSION DEVICE

CROSS-REFERENCE TO RELATED APPLICATION

The present application is based on PCT filing PCT/JP2020/041487, filed Nov. 6, 2020, the entire contents of which are incorporated herein by reference.

TECHNICAL FIELD

The present disclosure relates to a semiconductor device, and particularly relates to a semiconductor device including a front surface protective film.

BACKGROUND ART

In order to secure a breakdown voltage in a vertical semiconductor device used for a power device and the like, as disclosed in Patent Document 1, for example, providing a p-type guard ring region (termination well region) in a so-called termination region in an n-type semiconductor layer has been known.

In the semiconductor device including the guard ring region, an electric field generated when a reverse voltage is applied to a main electrode of the semiconductor device is reduced by a depletion layer formed by a pn junction between the n-type semiconductor layer and the p-type guard ring region, and avalanche breakdown at a rated voltage or lower, breakdown at an end portion of an electrode, and the like can be avoided.

In a metal oxide semiconductor field effect transistor (MOSFET) described in Patent Document 1, a p-type impurity region is formed to further project toward outer periphery than a front surface electrode and a gate wire layer. In the semiconductor device such as the MOSFET described above, usually, the front surface electrode is covered by a front surface protective film made of polyimide or the like, except a region in which wire bonding is performed. Further, the front surface electrode may be sealed using a sealing material such as gel.

Prior Art Documents

PATENT DOCUMENT

Patent Document 1: WO 2014/087600 A1

SUMMARY

Problem to be Solved by the Invention

The front surface protective film made of polyimide or the like and the sealing material such as gel described above are liable to contain moisture under a high humidity environment. The moisture contained in the front surface protective film and the sealing material may adversely affect the front surface electrode. Specifically, deposition reaction may be caused by the front surface electrode being dissolved into the moisture or by the moisture and the front surface electrode reacting with each other.

The front surface protective film made of polyimide or the like and the sealing material such as gel described above are liable to contain moisture under a high humidity environment. The moisture may adversely affect the front surface electrode. Specifically, deposition reaction may be caused by the front surface electrode being dissolved into the moisture or by the moisture and the front surface electrode reacting with each other. In such a case, the front surface electrode and the front surface protective film may be cracked, or the front surface protective film may be peeled in an interface between the front surface electrode and the front surface protective film. If cavities formed due to the cracks in the front surface electrode and the front surface protective film or the peeling of the front surface protective film act as leakage paths, insulation reliability of the semiconductor device may be deteriorated.

Technology according to the present disclosure is made to solve the problem as described above, and has an object to provide a semiconductor device with enhanced insulation reliability.

Means to Solve the Problem

A semiconductor device according to the present disclosure is a semiconductor device including an active region in which a main current flows in a thickness direction of a semiconductor substrate. The semiconductor substrate is divided into an inner region in which the active region is provided and an outer region surrounding the inner region. The semiconductor device includes a semiconductor layer of a first conductivity type, a termination well region of a second conductivity type being a conductivity type different from the first conductivity type, the termination well region being selectively provided in an upper layer portion of the semiconductor layer to surround the inner region in plan view, an impurity region of the first or second conductivity type, the impurity region being selectively provided in an upper layer portion of the termination well region, a front surface electrode being provided on a side of a second main surface of the semiconductor substrate, the second main surface being opposite to a first main surface of the semiconductor substrate, a back surface electrode being provided on the first main surface, an insulation film being provided to partially cover a top of the termination well region, an outer peripheral wire layer surrounding the inner region in the plan view, at least a part of the outer peripheral wire layer being provided on the insulation film, and an interlayer insulation film at least covering the insulation film and the outer peripheral wire layer. The termination well region extends from a boundary between the inner region and the outer region to the outer region. The front surface electrode is provided from the inner region to a top of the interlayer insulation film, and is connected to the impurity region through a first contact hole passing through the interlayer insulation film to reach the impurity region. The outer peripheral wire layer is provided so that an outer peripheral end portion of the outer peripheral wire layer on an outer peripheral side being opposite to the inner region in the plan view is located on an inner peripheral side with respect to an outer peripheral end portion of the termination well region being opposite to the inner region in the plan view, and is located on an outer side with respect to a position below an end portion of the front surface electrode on the interlayer insulation film.

Effects of the Invention

According to the semiconductor device of the present disclosure, generation of a deposited material at an end portion of the front surface electrode in a termination region being the outer region can be reduced, and cracks or peeling in the front surface electrode is reduced. As a result, increase of a leakage current and air discharge due to cracks or peeling in the front surface electrode can be reduced, and insulation reliability of the semiconductor device can thus be enhanced.

These and other objects, features, aspects and advantages of the present invention will become more apparent from the following detailed description of the present invention when taken in conjunction with the accompanying drawings.

DESCRIPTION OF EMBODIMENTS

<Introduction>

Figure 1:
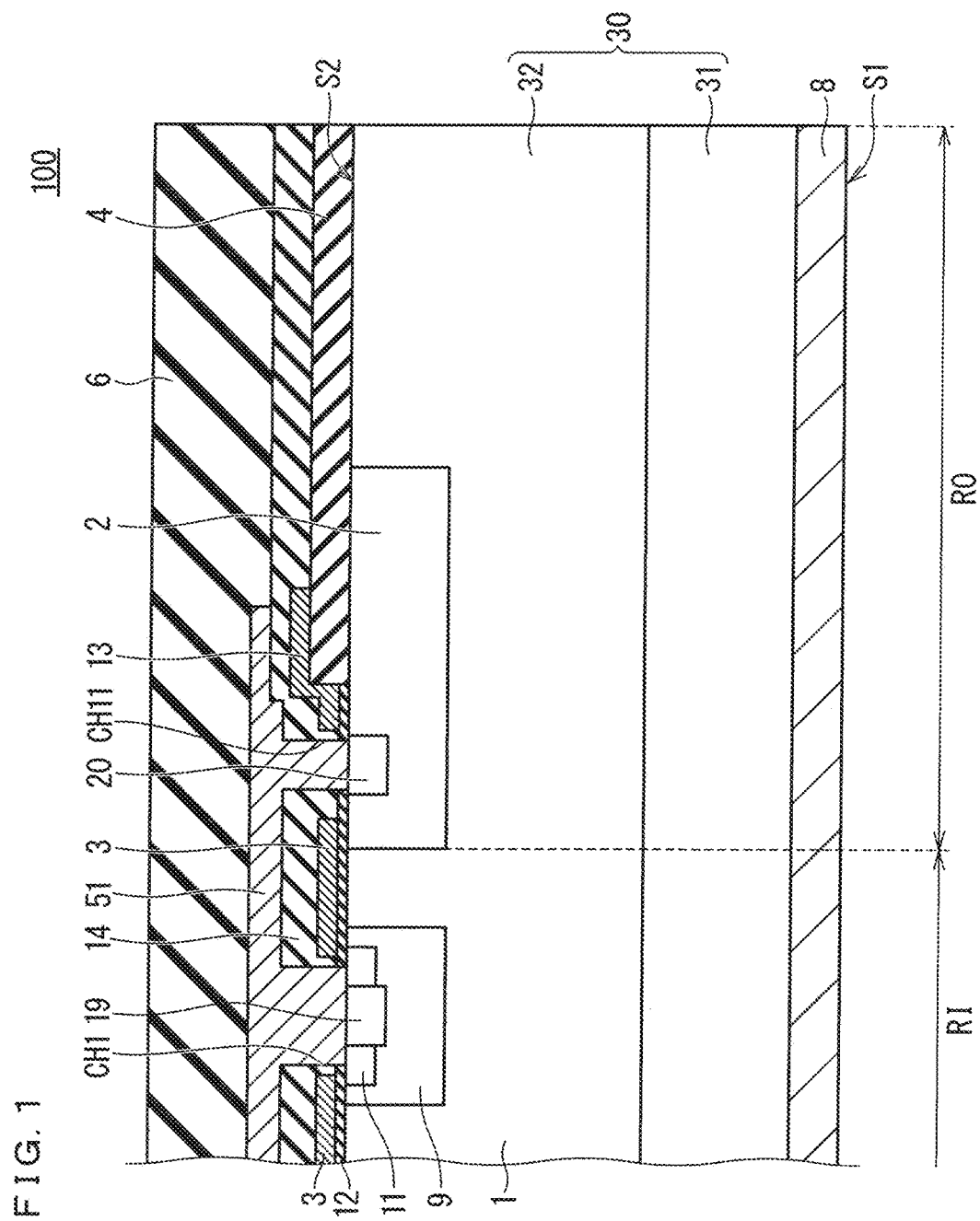
FIG. 1 is a partial cross-sectional diagram illustrating a configuration of a semiconductor device according to a first embodiment of the present disclosure.

The following description defines that an "active region" of a semiconductor device is a region in which the main current flows in an on-state of the semiconductor device, and a "termination region" of the semiconductor device is a region around the active region. Further, in the following description, an "outer side" of the semiconductor device implies a direction from a center portion toward an outer peripheral portion of the semiconductor device, and an "inner side" of the semiconductor device implies a direction opposite to the "outer side". Further, regarding conductivity types of impurities, the following description defines that an n type is a "first conductivity type", and a p type, which is a conductivity type opposite to the n type, is a "second conductivity type". However, conversely, the "first conductivity type" may be defined as the p type, and the "second conductivity type" may be defined as the n type.

Further, the term "MOS" is originally used for a junction structure of a metal-oxide-semiconductor, and is supposed to be an acronym for a metal-oxide-semiconductor. In electric field effect transistors (hereinafter simply referred to as "MOS transistors") including a MOS structure in particular, however, from the perspective of improvements in integration, manufacturing processes, and the like made in recent years, materials for gate insulation films and gate electrodes have been improved.

In the MOS transistor, for example, mainly from the perspective of self-aligned formation of sources and drains, polycrystalline silicon has been employed as the material for the gate electrodes instead of metal. Further, from the perspective of improvement in electrical characteristics, a high-permittivity material is employed as the material for the gate insulation films. The material, however, is not necessarily limited to oxide.

Hence, employment of the term "MOS" is not necessarily limited in a laminated structure of a metal-oxide-semiconductor, and neither is such limitation presupposed in this specification. In other words, in view of common general technical knowledge, here, the "MOS" is not simply an acronym arising from the origin of the term, but also widely encompasses conductor-insulator-semiconductor laminated structures.

Further, in the following description, description of "on/above X (on/above an upper surface of X)" and "covering X" does not exclude presence of an object between constituent elements. For example, description of "B provided on/above A (on/above an upper surface of A)" or "B covering A" may include a case in which another constituent element C is provided between A and B. Further, in the following description, terms indicating specific positions and directions may be used, such as "up", "down", "side", "bottom", "front", and "back". These terms, however, are used for the sake of convenience to facilitate understanding of details of embodiments and do not relate to directions in actual implementation.

Note that the drawings are schematically illustrated, and configurations are omitted or simplified in the drawings as appropriate for the sake of convenience of description. Further, interrelationships of the sizes and positions of configurations or the like illustrated in different drawings are not necessarily accurately illustrated, and may be changed as appropriate. Further, hatching may be used to facilitate understanding of details of embodiments not only in cross-sectional diagrams but also in the drawings such as plan views.

Further, in the following description, similar constituent elements are denoted by the same reference signs in the drawings, and are given similar terms and functions as well. Thus, detailed description regarding such constituent elements may be omitted in order to avoid redundancy.

Further, unless otherwise noted, in the following description, description such as "to be provided with", "to include", or "to have" a certain constituent element is not an exclusive expression excluding presence of another constituent element.

Further, in the following description, even when ordinal numbers such as "first" or "second" are used, these terms are used for the sake of convenience to facilitate understanding of details of embodiments, and the orders and the like that may be defined by these ordinal numbers are not restrictive.

Further, in the following description, unless otherwise noted, expressions indicating an equal state, such as "same", "equal", "uniform", or "homogeneous" include a case indicating a precisely equal state and a case in which there is a tolerance or a difference as long as similar functions are achieved.

Embodiments will be described below with reference to the accompanying drawings. In the following embodiments, detailed features and the like will be given for the sake of description of technology. However, those are merely examples, and not necessarily all of those are essential features to enable implementation of the embodiments.

<First Embodiment>

A configuration, an operation, and a manufacturing method of a semiconductor device according to a first embodiment will be described below.

<Configuration of Semiconductor Device>

Figure 2:
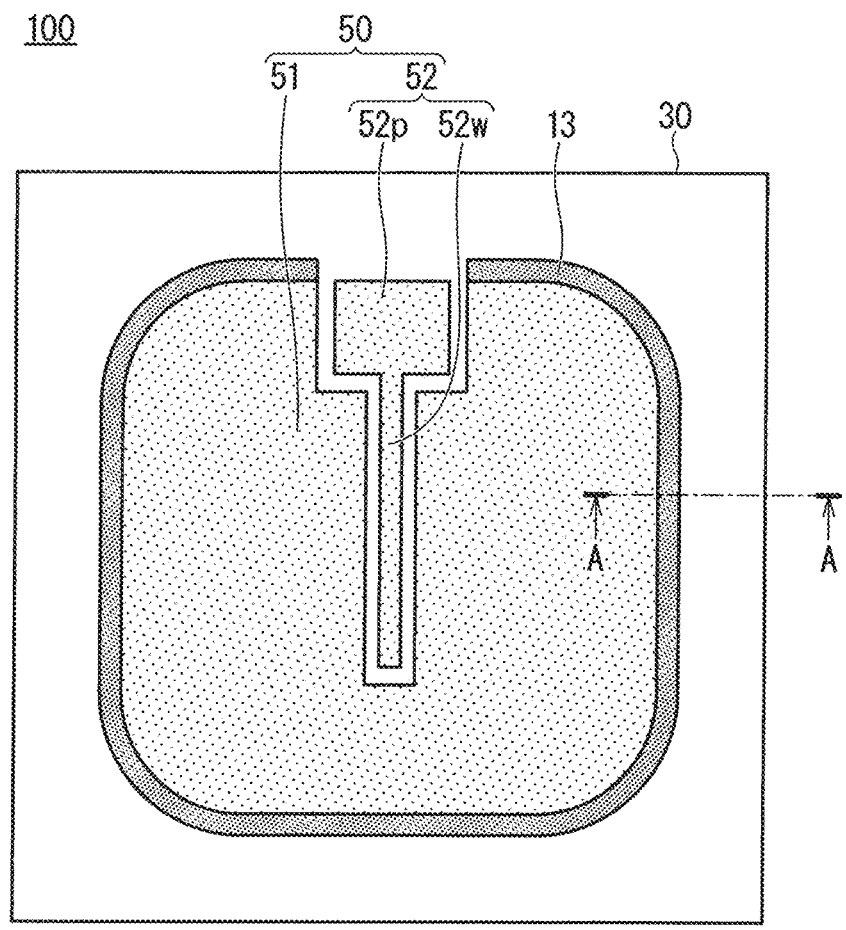
FIG. 2 is a plan view illustrating a configuration of the semiconductor device according to the first embodiment of the present disclosure.

FIG. 1 is a partial cross-sectional diagram illustrating a configuration of a MOSFET 100 being a semiconductor device according to the first embodiment. FIG. 2 is a plan view of the MOSFET 100. Note that a cross-sectional diagram taken along the line A-A as seen in a direction of the arrows in FIG. 2 corresponds to FIG. 1. Note that, in FIG. 2, for the sake of convenience, of an upper surface configuration of the MOSFET 100, a front surface protective film 6 (upper surface film) is omitted. Further, in FIG. 1, the right side corresponds to the termination region of the MOSFET 100, and the left side corresponds to the active region in which the main current flows in the on-state of the MOSFET 100.

Figure 3:
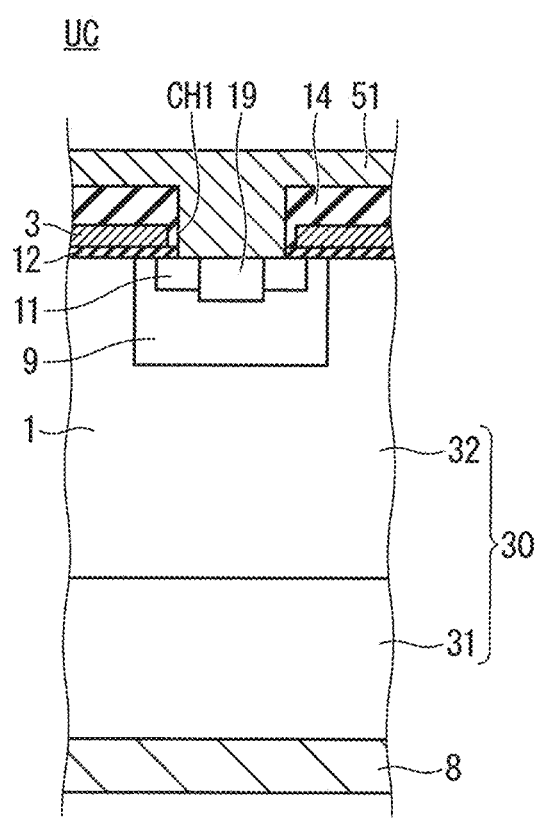
FIG. 3 is a partial cross-sectional diagram illustrating a configuration of the semiconductor device according to the first embodiment of the present disclosure.

Further, FIG. 3 is a cross-sectional diagram illustrating a configuration of a unit cell UC being a minimum unit structure for the MOSFET 100 formed in an inner region RI being the active region illustrated in FIG. 1. In the inner region RI of the MOSFET 100, a plurality of unit cells UC, one of which is illustrated in FIG. 3, are arrayed, and a structure illustrated at the left end of FIG. 1 corresponds to an outermost peripheral unit cell UC in the inner region RI.

As illustrated in FIG. 1, the MOSFET 100 is formed into an epitaxial substrate 30 consisting of a single crystal substrate 31 and an epitaxial layer 32 formed on an upper surface of the single crystal substrate 31. The single crystal substrate 31 is a semiconductor substrate made of silicon carbide (SiC) of the n type (first conductivity type), and the epitaxial layer 32 is a semiconductor layer of the n type made of SiC epitaxially grown on the upper surface of the single crystal substrate 31. In other words, the MOSFET 100 is a SiC-MOSFET. Note that the epitaxial substrate 30 is a SiC substrate having a 4H polytype in the first embodiment.

In an upper layer portion of the epitaxial layer 32 in the active region, that is, the inner region RI, an element well region 9 of the p type (second conductivity type) is selectively formed. Further, in the upper layer portion of the element well region 9, a source region 11 of the n type and a contact region 19 of the p type having impurity concentration higher than that of the element well region 9 are each selectively formed.

In an upper layer portion of the epitaxial layer 32 in the termination region, that is, the outer region RO surrounding the inner region RI, a termination well region 2 of the p type is selectively formed. The termination well region 2 is a frame-like (ring-like) region surrounding the active region in plan view, and functions as a so-called guard ring.

In an upper layer portion of the termination well region 2, a high concentration region 20 of the p type having relatively high impurity concentration is selectively formed to surround the active region. Here, the high concentration region 20 is not limited to the p type and may be the n type. By providing the high concentration region 20, a contact resistance can be reduced.

An n-type region of the epitaxial layer 32 except the element well region 9, the source region 11, the contact region 19, and the termination well region 2 corresponds to a drift layer 1 in which a current flows with drift.

Impurity concentration of the drift layer 1 is lower than impurity concentration of the single crystal substrate 31. Thus, the single crystal substrate 31 has resistivity lower than that of the drift layer 1. Here, the impurity concentration of the drift layer 1 is, for example, $1\times10^{14}/cm^3$ or more and $1\times10^{17}/cm^3$ or less.

The termination well region 2 is formed in the upper layer portion of the epitaxial layer 32 so as to extend from a boundary between the inner region RI and the outer region RO toward the outer region RO. Note that, with a boundary being set at an end portion (inner peripheral end portion) of the termination well region 2 on an inner side (inner peripheral side), an inner side with respect to the boundary is defined as the inner region RI and an outer side with respect to the boundary is defined as the outer region RO.

Further, as illustrated in FIG. 1, on an upper surface S2 (second main surface) of the epitaxial substrate 30 in the active region, a gate insulation film 12 is formed to extend over the source region 11, over the element well region 9 interposed between the source region 11 and the drift layer 1, and over the drift layer 1. Further, on an upper surface of the gate insulation film 12, a gate electrode 3 is formed. An upper layer portion of the element well region 9 covered by the gate insulation film 12 and the gate electrode 3, that is, a part of the element well region 9 interposed between the source region 11 and the drift layer 1, corresponds to a channel region in which an inversion channel is formed when the MOSFET 100 enters the on-state.

In the active region, the gate electrode 3 is covered by an interlayer insulation film 14, and a source electrode 51 is formed on an upper surface of the interlayer insulation film 14. Thus, the gate electrode 3 and the source electrode 51 are electrically insulated from each other by the interlayer insulation film 14. Note that the interlayer insulation film 14 has, for example, elemental composition of boron or phosphorus.

Note that the gate insulation film 12 and the gate electrode 3 are formed to extend also over the termination well region 2 in the outer region RO, and over the element well region 9 interposed between the source region 11 and the drift layer 1 and over the drift layer 1 of the outermost peripheral unit cell UC in the inner region RI, and are led out to the outer region RO. The gate insulation film 12 and the gate electrode 3 are covered by the interlayer insulation film 14. The gate electrode 3 led out to the outer region RO is connected to the gate electrode 3 provided in the active region.

The interlayer insulation film 14 covers a field insulation film 4 to extend to the outer side of the termination well region 2.

Further, as illustrated in FIG. 1, on the upper surface S2 of the epitaxial substrate 30 in the termination region, the field insulation film 4 having film thickness larger than that of the gate insulation film 12 is provided. The field insulation film 4 covers a part of the termination well region 2, and extends beyond an outer peripheral end of the termination well region 2 to extend to the outer side of the termination well region 2. Further, the field insulation film 4 is not provided in the inner region RI. In other words, the field insulation film 4 has an opening including the inner region RI in plan view.

At an inner edge portion of the opening of the field insulation film 4, an outer peripheral wire layer 13 is formed to climb onto an upper surface of the field insulation film 4 from the top of the gate insulation film 12, and is disposed above the termination well region 2 with the gate insulation film 12 or the field insulation film 4 being interposed therebetween. The outer peripheral wire layer 13 as well as the gate insulation film 12 is covered by the interlayer insulation film 14.

Further, as illustrated in FIG. 1, a portion of the outer peripheral wire layer 13 is formed to extend 1 μm or longer on an outer side with respect to a position below an outer peripheral edge portion of the source electrode 51.

A contact hole CH1 passing through the interlayer insulation film 14 and the gate insulation film 12 to reach the source region 11 and the contact region 19 and a contact hole CH11 (first contact hole) passing through the interlayer insulation film 14 and the gate insulation film 12 to reach the high concentration region 20 are provided. The source electrode 51 is connected to the source region 11 and the contact region 19 through the contact hole CH1, and is connected to the high concentration region 20 through the contact hole CH11.

The source electrode 51 and the contact region 19 form an ohmic contact through the contact hole CH1. Further, the source electrode 51 and the high concentration region 20 form an ohmic contact or a Schottky contact through the contact hole CH11.

Further, as illustrated in FIG. 1, a back surface electrode 8 functioning as a drain electrode is formed on a lower surface S1 (first main surface) of the epitaxial substrate 30.

As illustrated in FIG. 2, the outer peripheral wire layer 13 extends to the termination region located on an outer side with respect to outer periphery of the source electrode 51, and substantially surrounds the source electrode 51. The source electrode 51 is provided in such a manner that a slit portion provided from one side of the source electrode 51 having a substantially rectangular shape in plan view extends to a position beyond the half of the source electrode 51, and a gate wire 52w enters the slit portion. In other words, a gate pad 52p enters a recessed portion provided on one side of the source electrode 51, a gate part 52 having the gate wire 52w entering the slit portion continuing from the recessed portion is provided, and the gate part 52 except a portion thereof is formed to be surrounded by the source electrode 51 in plan view. Note that a combination of the source electrode 51 and the gate part 52 is referred to as a front surface electrode 50.

The gate wire 52w is electrically connected to the gate electrode 3 led out from the active region through a contact hole (not illustrated), and a gate control signal is given to the gate electrode 3 in the active region.

The gate part 52, that is, the gate pad 52p and the gate wire 52w, functions as an electrode that receives the gate control signal for controlling an electrical path between the source electrode 51 and the back surface electrode 8. As illustrated in FIG. 2, the gate part 52 is separated away from the source electrode 51, and is also electrically insulated from the source electrode 51.

Note that, in FIG. 1, the front surface protective film 6 is formed to cover the source electrode 51 and the interlayer insulation film 14 exposed without being covered by the source electrode 51. However, the front surface protective film 6 has openings above the source electrode 51 and above the gate part 52 (FIG. 2), which enables electrical connection between the source electrode 51 and the gate part 52 and the outside.

<First Modification>

Figure 4:
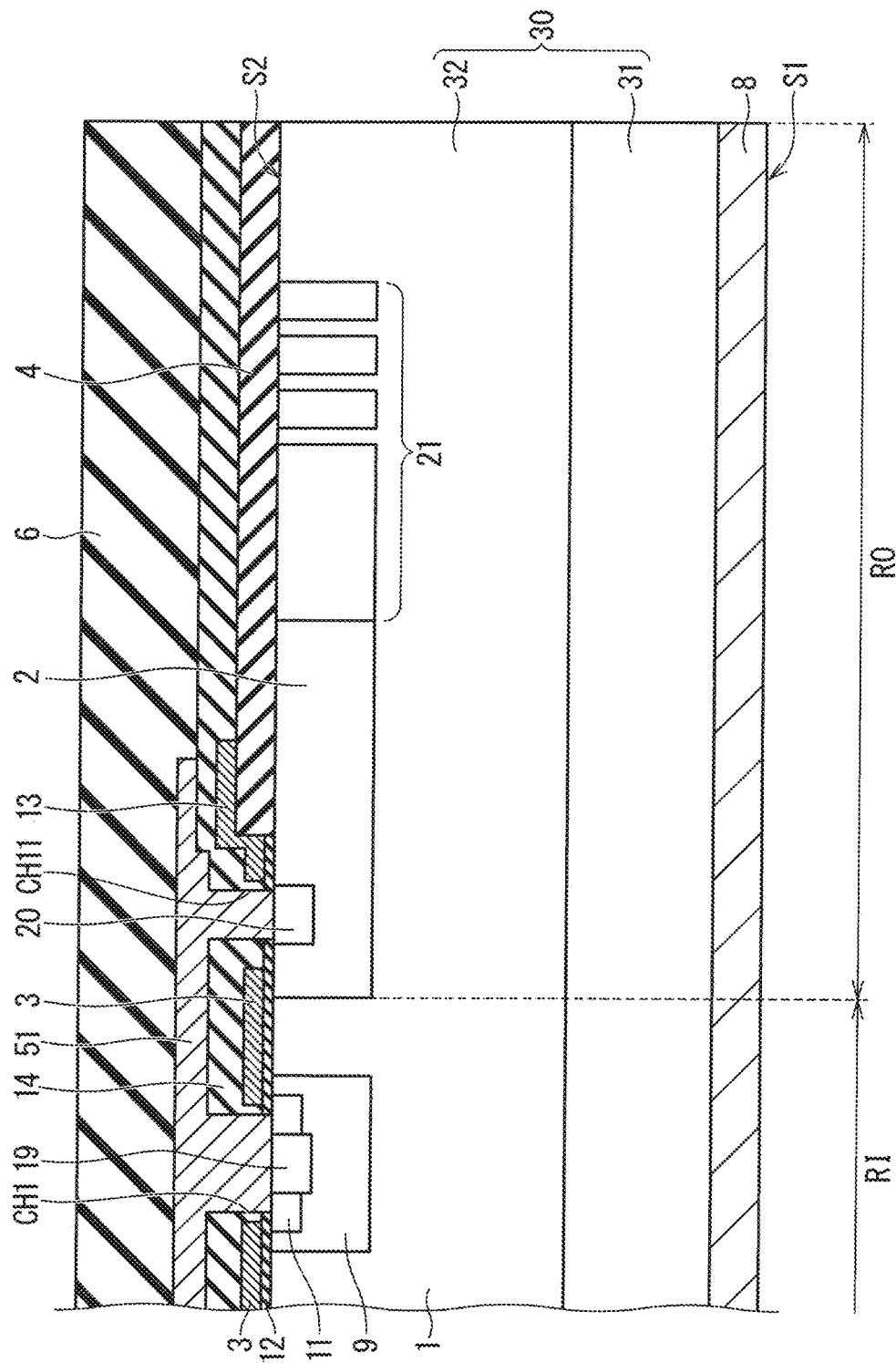
FIG. 4 is a partial cross-sectional diagram illustrating a configuration of a modification of the semiconductor device according to the first embodiment of the present disclosure.

FIG. 4 is a cross-sectional diagram illustrating a configuration of a MOSFET 101 as a modification of the first embodiment. Note that, in FIG. 4, the same configurations as those of the MOSFET 100 described with reference to FIG. 1 are denoted by the same reference signs, and redundant description will be omitted.

As illustrated in FIG. 4, the MOSFET 101 includes a low concentration well region 21 of the p type, which is provided in an upper layer portion of the drift layer 1 on an outer peripheral side with respect to the termination well region 2. The low concentration well region 21 is provided as multiple frame-like regions surrounding the termination well region 2 in plan view, but is not limited to such multiple regions and may be a single frame-like region. Impurity concentration of the low concentration well region 21 is equal to or lower than impurity concentration of the termination well region 2.

<Second Modification>

Figure 5:
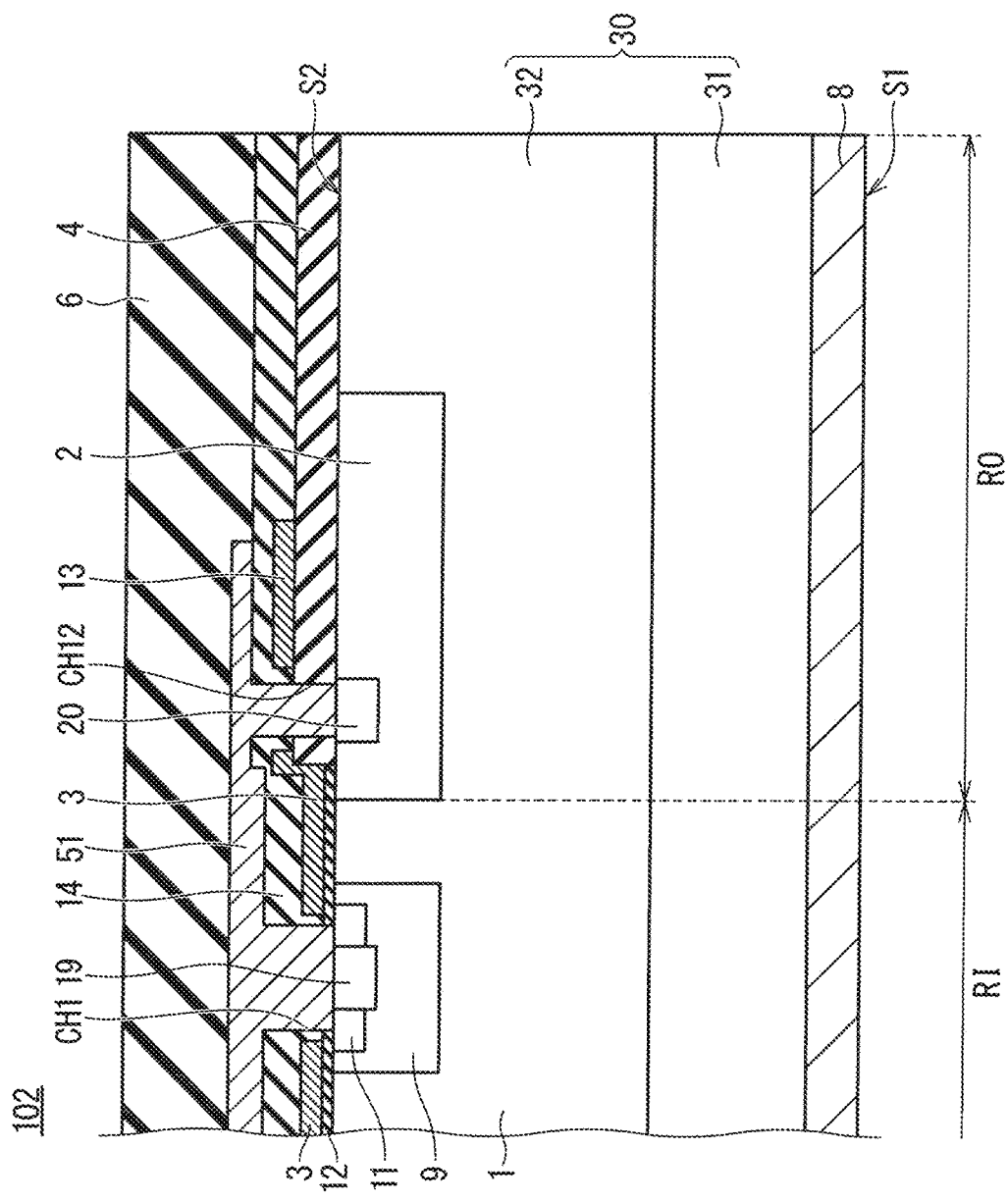
FIG. 5 is a partial cross-sectional diagram illustrating a configuration of a modification of the semiconductor device according to the first embodiment of the present disclosure.

FIG. 5 is a cross-sectional diagram illustrating a configuration of a MOSFET 102 as a modification of the first embodiment. Note that, in FIG. 5, the same configurations as those of the MOSFET 100 described with reference to FIG. 1 are denoted by the same reference signs, and redundant description will be omitted.

As illustrated in FIG. 5, in the MOSFET 102, the field insulation film 4 is provided to extend to a position near an inner edge portion of the termination well region 2, and the gate electrode 3 led out to the outer region RO is formed to climb onto the inner edge portion of the field insulation film 4.

The source electrode 51 is connected to the high concentration region 20 so as to form an ohmic contact or a Schottky contact therewith through a contact hole CH12 passing through the interlayer insulation film 14 and the field insulation film 4 to reach the high concentration region 20. The outer peripheral wire layer 13 is provided on the field insulation film 4 on an outer side with respect to the contact hole CH12.

<Third Modification>

Figure 6:
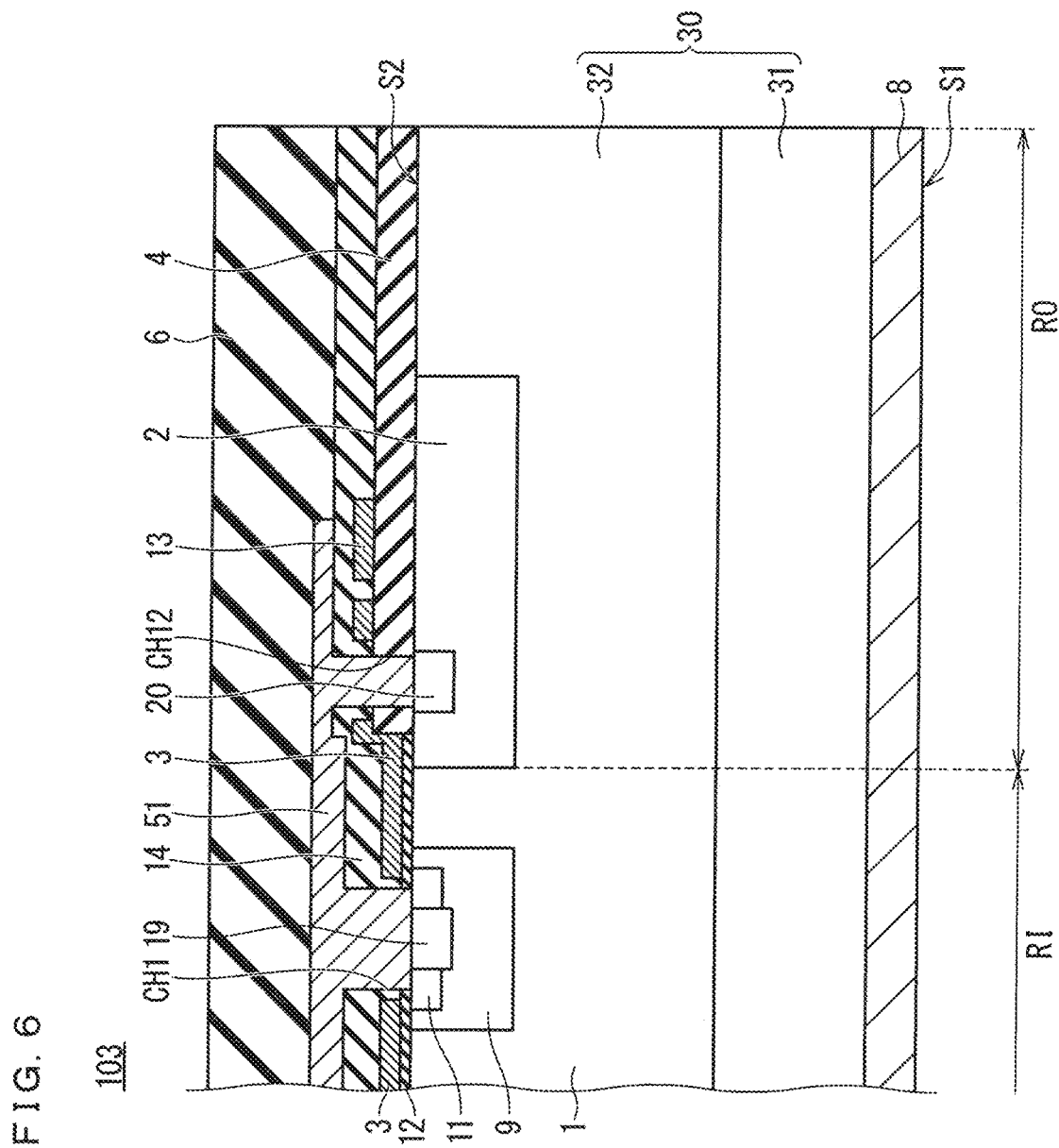
FIG. 6 is a partial cross-sectional diagram illustrating a configuration of a modification of the semiconductor device according to the first embodiment of the present disclosure.

FIG. 6 is a cross-sectional diagram illustrating a configuration of a MOSFET 103 as a modification of the first embodiment. Note that, in FIG. 6, the same configurations as those of the MOSFET 100 described with reference to FIG. 1 are denoted by the same reference signs, and redundant description will be omitted.

As illustrated in FIG. 6, in the MOSFET 103, the field insulation film 4 is provided to extend to a position near the inner edge portion of the termination well region 2, and the gate electrode 3 led out to the outer region RO is formed to climb onto the field insulation film 4 and extend to a position near the outer peripheral wire layer 13.

The source electrode 51 is connected to the high concentration region 20 so as to form an ohmic contact or a Schottky contact therewith through the contact hole CH12 passing through the interlayer insulation film 14 and the field insulation film 4 to reach the high concentration region 20. The outer peripheral wire layer 13 is provided to be separated away from the gate electrode 3 on the field insulation film 4 on an outer side with respect to the gate electrode 3 extending beyond the contact hole CH12.

<Fourth Modification>

Figure 7:
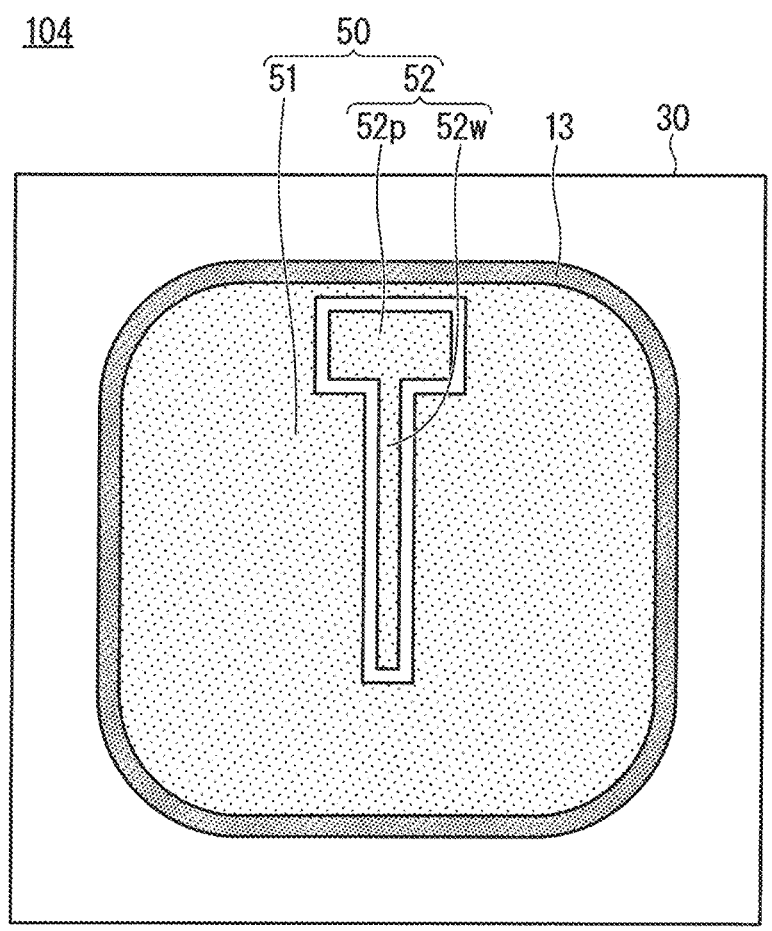
FIG. 7 is a plan view illustrating a configuration of a modification of the semiconductor device according to the first embodiment of the present disclosure.

FIG. 7 is a plan view illustrating a configuration of a MOSFET 104 as a modification of the first embodiment. Note that, in FIG. 7, the same configurations as those of the MOSFET 100 described with reference to FIG. 2 are denoted by the same reference signs, and redundant description will be omitted.

As illustrated in FIG. 7, in the MOSFET 104, the gate part 52 consisting of the gate pad 52*p* and the gate wire 52*w* is provided so that its entire periphery is surrounded by the source electrode 51 in plan view, and the outer peripheral wire layer 13 is provided to surround outer periphery of the source electrode 51.

By employing such a configuration, deposition of an insulator at an outer peripheral end portion of the source electrode 51 can be reduced in the entire periphery of the termination region, and cracks and peeling in the source electrode 51 and the front surface protective film 6 can be reduced. Accordingly, insulation reliability of the semiconductor device can be enhanced.

<Fifth Modification>

Figure 8:
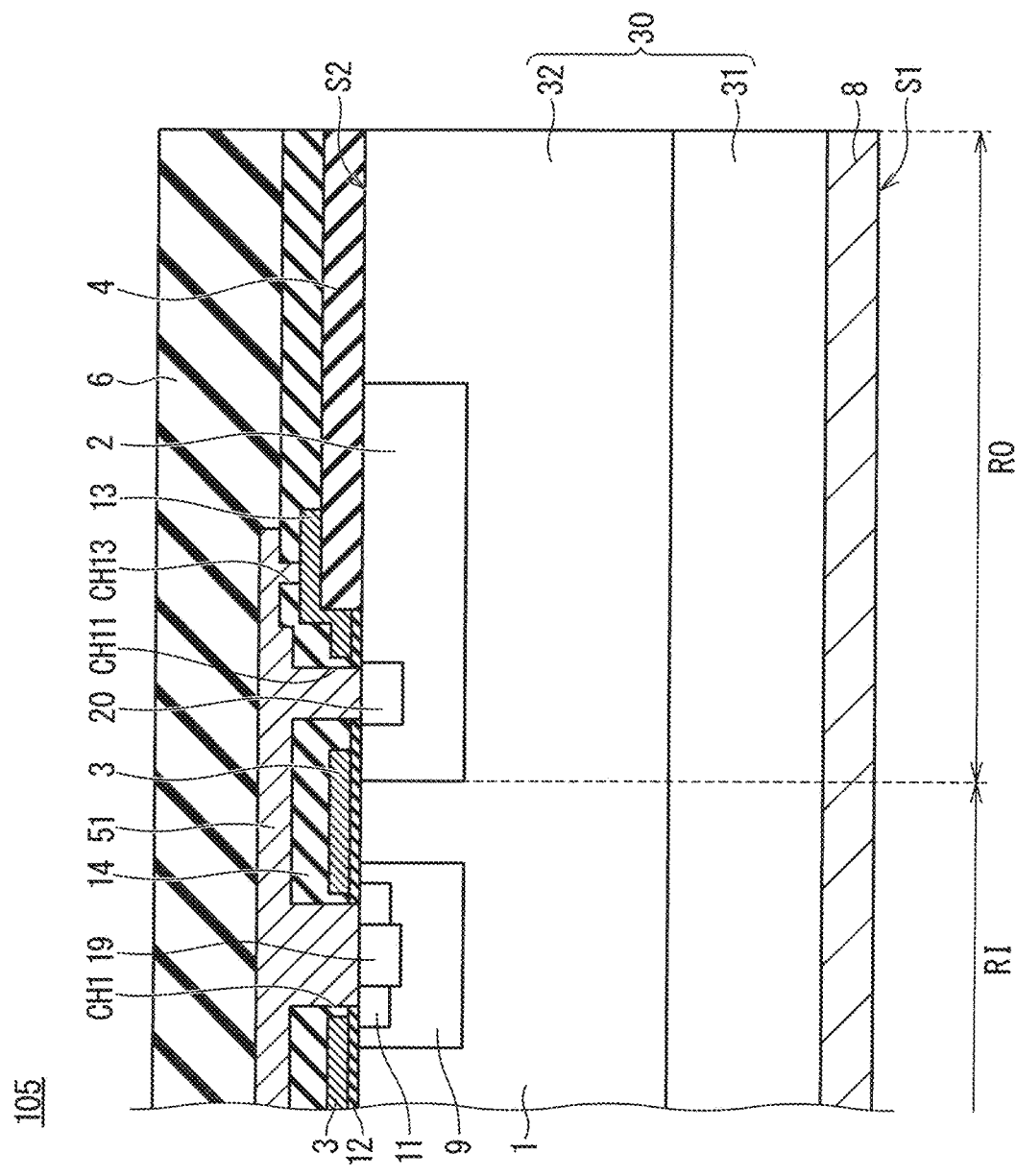
FIG. 8 is a partial cross-sectional diagram illustrating a configuration of a modification of the semiconductor device according to the first embodiment of the present disclosure.

FIG. 8 is a cross-sectional diagram illustrating a configuration of a MOSFET 105 as a modification of the first embodiment. Note that, in FIG. 8, the same configurations as those of the MOSFET 100 described with reference to FIG. 1 are denoted by the same reference signs, and redundant description will be omitted.

As illustrated in FIG. 8, in the MOSFET 105, a contact hole CH13 (second contact hole) passing through the interlayer insulation film 14 to reach the outer peripheral wire layer 13 is provided above the outer peripheral wire layer 13 on the field insulation film 4, and the source electrode 51 and the outer peripheral wire layer 13 are connected through the contact hole CH13. Note that the number of contact holes CH13 is not limited to one, and a plurality of contact holes CH13 may be provided.

By employing such a configuration, electric field strength of the outer peripheral end portion of the source electrode 51 can be more effectively reduced and deposition of an insulator can be reduced. Consequently, cracks and peeling in the source electrode and the upper surface film can be reduced, and insulation reliability of the semiconductor device can thus be enhanced.

<Sixth Modification>

Figure 9:
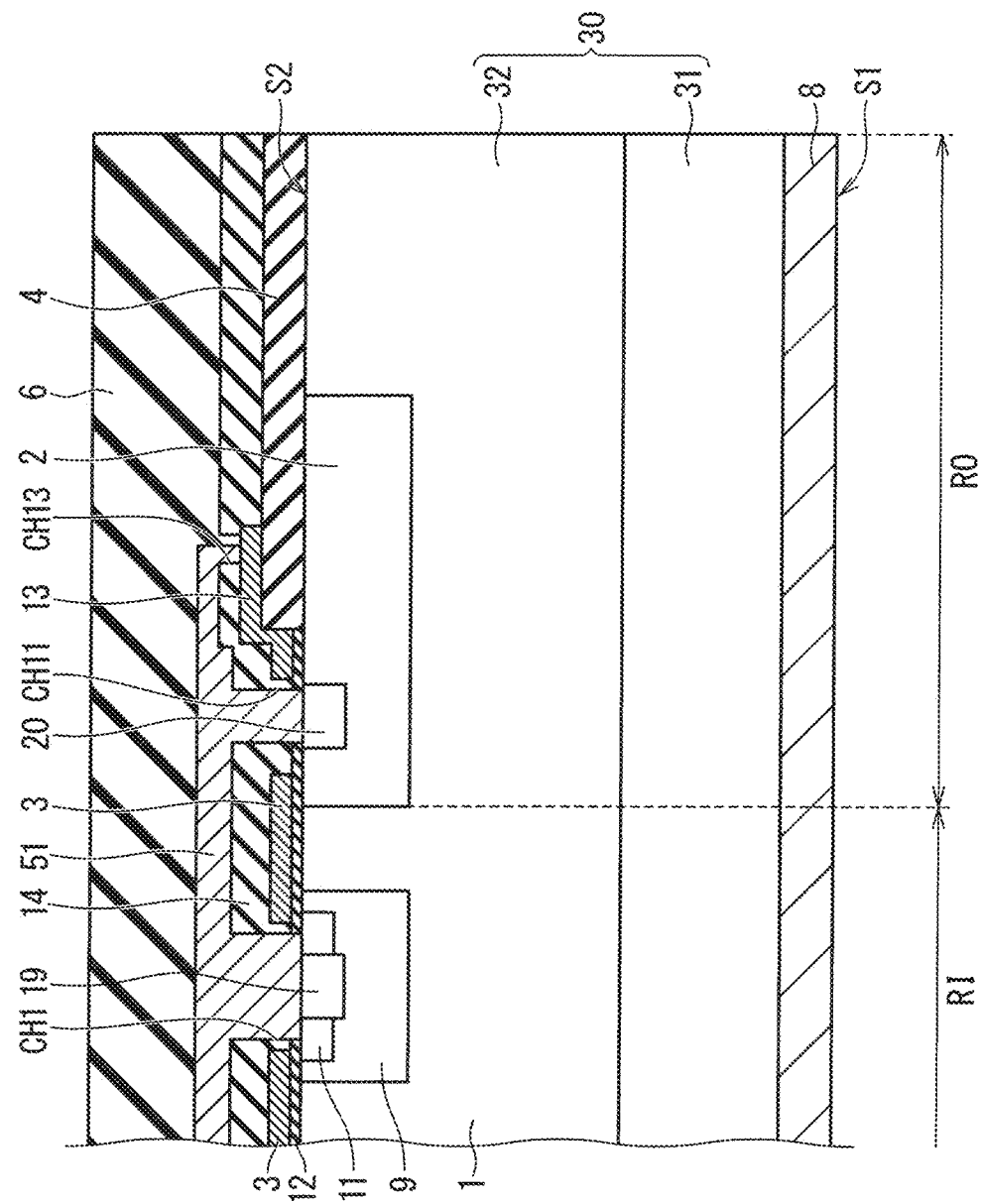
FIG. 9 is a partial cross-sectional diagram illustrating a configuration of a modification of the semiconductor device according to the first embodiment of the present disclosure.

FIG. 9 is a cross-sectional diagram illustrating a configuration of a MOSFET 106 as a modification of the first embodiment. Note that, in FIG. 9, the same configurations as those of the MOSFET 100 described with reference to FIG. 1 are denoted by the same reference signs, and redundant description will be omitted.

As illustrated in FIG. 9, in the MOSFET 106, the contact hole CH13 passing through the interlayer insulation film 14 to reach the outer peripheral wire layer 13 is provided above the outer peripheral wire layer 13 on the field insulation film 4, and the source electrode 51 and the outer peripheral wire layer 13 are connected through the contact hole CH13. The contact hole CH13 is provided at a portion located on the outermost periphery of the source electrode 51, and the outermost periphery of the source electrode 51 and the outer peripheral wire layer 13 are connected.

By employing such a configuration, electric field strength of the outer peripheral end portion of the source electrode 51 can be more effectively reduced and deposition of an insulator can be reduced. Consequently, cracks and peeling in the source electrode and the upper surface film can be reduced, and insulation reliability of the semiconductor device can thus be enhanced.

<Operation of Semiconductor Device>

Next, an operation of the MOSFET 100 according to the first embodiment described with reference to FIG. 1 and FIG. 2 will be described in two states.

A first state is a state in which a positive voltage at a threshold or higher is applied to the gate electrode 3, and this state is hereinafter referred to as an "on-state". When the MOSFET 100 is in the on-state, an inversion channel is formed in the channel region. The inversion channel serves as a path for electrons as carriers to flow between the source region 11 and the drift layer 1. In the on-state, when a high voltage, with reference to a potential of the source electrode 51, is applied to the back surface electrode 8, a current passing through the single crystal substrate 31 and the drift layer 1 flows.

The voltage between the source electrode 51 and the back surface electrode 8 in this case is referred to as an "on-voltage", and the current flowing between the source electrode 51 and the back surface electrode 8 is referred to as an "on-current". The on-current flows only in the active region where there is a channel, and does not flow in the termination region.

A second state is a state in which a voltage lower than the threshold is applied to the gate electrode 3, and this state is hereinafter referred to as an "off-state". When the MOSFET 100 is in the off-state, an inversion channel is not formed in the channel region. Accordingly, the on-current does not flow. Thus, when a high voltage is applied between the source electrode 51 and the back surface electrode 8, the high voltage is maintained. The voltage between the gate electrode 3 and the source electrode 51 in this case is significantly lower than the voltage between the source electrode 51 and the back surface electrode 8, and thus the high voltage is applied also between the gate electrode 3 and the back surface electrode 8.

In the off-state, also in the termination region, the high voltage is applied between each of the source electrode 51, the gate part 52, and the gate electrode 3 and the back surface electrode 8. Note that, an electrical contact between the termination well region 2 and the source electrode 51 is formed in the termination region, as in the case where an electrical contact between the element well region 9 and the source electrode 51 is formed in the active region. This forestalls application of a high electric field to the gate insulation film 12, the field insulation film 4, and the interlayer insulation film 14.

When the MOSFET 100 is in the off-state, a high electric field is applied near pn junction interfaces between the drift layer 1 and the element well region 9 and between the drift layer 1 and the termination well region 2. A voltage to the back surface electrode 8 when avalanche breakdown occurs with the electric field having reached a critical electric field is defined as a maximum voltage (avalanche voltage) of the MOSFET 100. Usually, a rated voltage is determined such that the MOSFET 100 is used within a range of voltages that does not cause avalanche breakdown.

In the off-state of the MOSFET 100, depletion layers expand from pn junction interfaces between the drift layer 1 and the element well region 9 and between the drift layer 1 and the termination well region 2 toward a direction to the single crystal substrate 31, that is, a downward direction in FIG. 1, and a direction to outer periphery of the drift layer 1, that is, a direction from the inner region RI to the outer region RO in FIG. 1. Further, a depletion layer also expands from the pn junction interface between the drift layer 1 and the termination well region 2 into the termination well region 2, and a degree of the expansion greatly depends upon the impurity concentration of the termination well region 2. In other words, when the impurity concentration of the termination well region 2 is increased, the expansion of the depletion layer in the termination well region 2 is reduced, which allows a forefront position of the depletion layer to be located at a position close to the boundary between the termination well region 2 and the drift layer 1.

Note that the forefront position of the depletion layer can be examined using a technology CAD (TCAD) simulation or the like. In the outer region RO, in a depletion layer inside the epitaxial layer 32, that is, a depleted region, a potential difference is generated from an outer peripheral side of the epitaxial layer 32 toward the center.

In the off-state, in the semiconductor device that uses SiC having particularly high electric field strength or the like as a material, when an end portion of an electrode material is located at a position where an upper surface of the epitaxial layer 32 is depleted, the high electric field is applied also to the end portion of the electrode material, which may lead to breakdown of the electrode material. Thus, in the MOSFET 100 according to the first embodiment, the impurity concentration of the termination well region 2 is set to such impurity concentration that does not cause depletion in an upper surface of the termination well region 2 below the source electrode 51 and the gate part 52.

Here, a case is considered in which the MOSFET 100 enters the off-state under high humidity. Sealing resin provided to cover a semiconductor chip may contain moisture. For example, when the front surface protective film 6 (upper surface film) is made of a resin material having high absorbency, such as polyimide, under high humidity, the front surface protective film 6 may contain much moisture, and the moisture may reach upper surfaces of the epitaxial layer 32 and the source electrode 51. Further, when the front surface protective film 6 is made of a material having high humidity resistance, such as SiN, cracks may be liable to be formed in the front surface protective film 6 due to a stress and the like caused during processes, and the epitaxial layer 32 and the source electrode 51 may be exposed to moisture through the cracks.

In such a state, due to a voltage applied to the MOSFET 100 in the off-state, an end portion of the epitaxial layer 32 acts as an anode, and the source electrode 51 acts as a cathode in the termination region. Near the source electrode 51 to act as a cathode, moisture causes reduction reaction of oxygen shown in formula (1) and generation reaction of hydrogen shown in formula (2) below.

$$O_2+2H_2O+4e^-\rightarrow 4OH^-\ldots \quad (1)$$

$$H_2O+e^-OH^-+1/2H_2\ldots \quad (2)$$

Due to this, concentration of hydroxide ions is increased near the source electrode 51. The hydroxide ions chemically react with the source electrode 51. For example, when the source electrode 51 is made of aluminum, aluminum may turn into aluminum hydroxide through the chemical reaction.

The reaction between aluminum and hydroxide ions are accelerated according to surrounding electric field strength. Inside the semiconductor layer, a potential gradient is generated in a depleted region, and thus in the MOSFET 100 according to the first embodiment, a potential gradient is generated along the upper surface S2 in a region in which the depletion layer reaches an upper surface of the epitaxial substrate 30.

Figure 10:
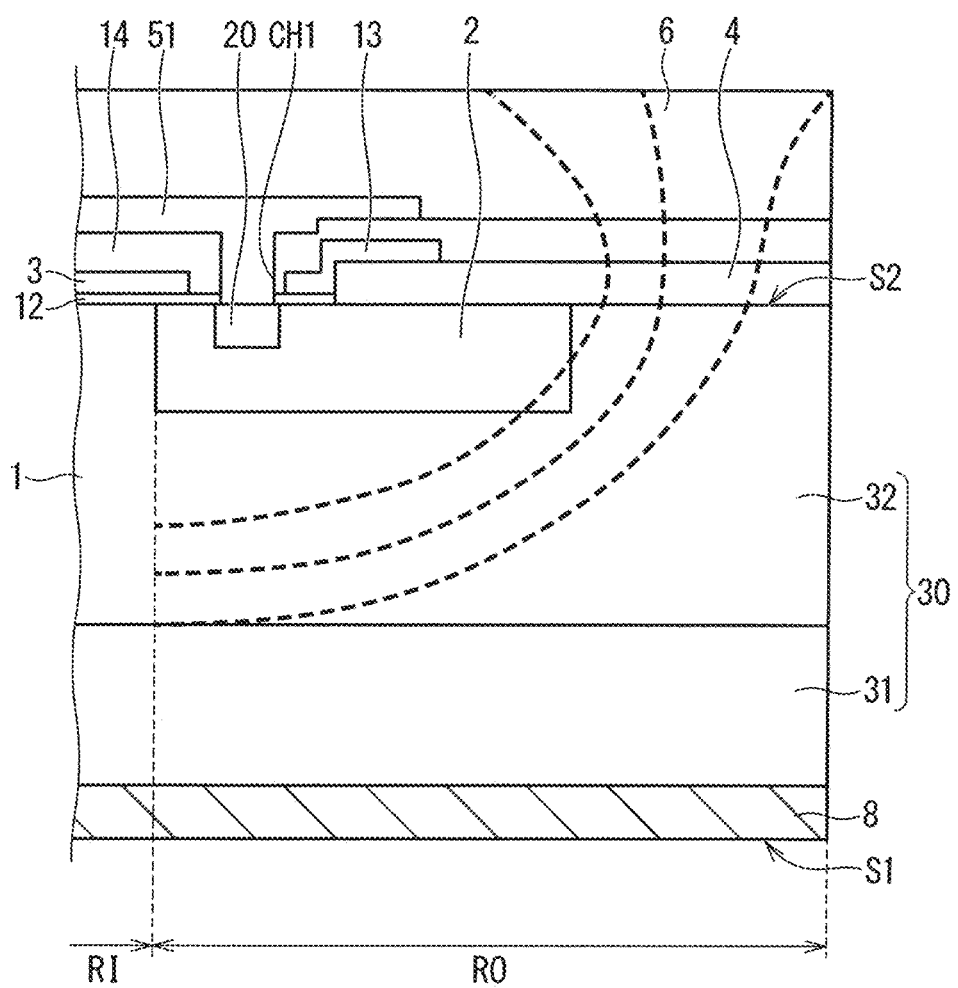
FIG. 10 is a diagram illustrating a region in which a depletion layer reaches an upper surface of an epitaxial substrate.

FIG. 10 is a diagram illustrating a region in which the depletion layer reaches the upper surface of the epitaxial substrate 30, in which equipotential lines are indicated by broken lines. In FIG. 10, a region in which a potential difference is formed at the boundary between the epitaxial layer 32 and the field insulation film 4 is a region in which the depletion layer reaches the upper surface of the epitaxial substrate 30, and is located on the inner side or the outer side depending on the impurity concentration of the termination well region 2.

As illustrated in FIG. 10, the equipotential lines are formed in a manner of crossing the interface between the epitaxial layer 32 and the field insulation film 4 substantially at right angles, and accordingly potential gradients are generated also in the field insulation film 4 and the interlayer insulation film 14, and electric fields are generated around the end portion of the source electrode 51. Consequently, when electric field strength at the end portion of the source electrode 51 reaches a certain value or higher, generation reaction of aluminum hydroxide is caused, and the reaction is accelerated along with increase of the electric field strength.

Further, when a potential of the termination well region 2 becomes higher than that of the source electrode 51 due to electrical resistance occurring in a contact region between the source electrode 51 and the termination well region 2, sheet resistance of the termination well region 2, and a diffusion potential of a pn junction between the high concentration region 20 and the termination well region 2 caused when the high concentration region 20 is of the n type, electric field strength below the source electrode 51 is increased.

Further, when the concentration of the termination well region 2 is low and the depletion layer expanding from the pn junction interface between the drift layer 1 and the termination well region 2 into the termination well region 2 reaches the upper surface S2, a potential gradient is generated along the upper surface S2 in the termination well region 2. In this case, a region on the upper surface S2 to have a high potential becomes closer to the source electrode 51, and the electric field strength below the source electrode 51 is further increased.

In such a case, electric field concentration is liable to be caused at an outer peripheral end portion below the source electrode 51 in particular, and generation of aluminum hydroxide is accelerated.

When the interlayer insulation film 14 contains boron (B) or phosphorus (P), higher concentration thereof makes the interlayer insulation film 14 more liable to absorb moisture. For example, when concentration of boron exceeds 2% and concentration of phosphorus exceeds 5%, such a tendency becomes noticeable, and generation of aluminum hydroxide is accelerated.

When aluminum hydroxide is generated on a surface of the source electrode 51 as described above, cracks or peeling in the source electrode 51 and the front surface protective film 6 is caused due to cubical expansion, and cavities are formed in the upper surface of the interlayer insulation film 14. A flow of an excessive leakage current due to entrance of moisture into the cavities and air discharge in the cavities may lead to breakdown of the MOSFET 100.

In contrast, in the MOSFET 100 according to the first embodiment, as illustrated in the cross-sectional diagram of FIG. 1, the outer peripheral end portion of the source electrode 51 is located on an inner peripheral side with respect to an outer peripheral end portion of the termination well region 2, and thus electric field strength around the source electrode 51 is reduced.

Here, by setting the impurity concentration of the termination well region 2 to a certain value or higher, the depletion layer scarcely ever expands into the termination well region 2, and electric field strength around the gate pad 52p illustrated in FIG. 2 can be effectively reduced. Therefore, generation of aluminum hydroxide can be effectively reduced.

Further, as illustrated in FIG. 4, as in the MOSFET 101, by providing the low concentration well region 21 in an upper layer portion of the drift layer 1 on an outer peripheral side with respect to the termination well region 2, a region on the upper surface S2 to have a high potential is brought further away from the source electrode 51, and electric field strength around the source electrode 51 can be effectively reduced and electric field strength of the epitaxial layer 32 around the outer peripheral end portion of the termination well region 2 can be reduced. Therefore, the avalanche voltage of the MOSFET 101 can be increased.

Further, in the MOSFET 100 according to the first embodiment, as illustrated in the cross-sectional diagram of FIG. 1, the outer peripheral wire layer 13 is formed below the outer peripheral end portion of the source electrode 51. The outer peripheral wire layer 13 has a potential between those of the source electrode 51 and the termination well region 2, and by bringing away a region to have the potential on an outer peripheral side with respect to the source electrode 51, electric field concentration due to a potential difference between the source electrode 51 and the termination well region 2 is reduced around the outer peripheral end portion of the source electrode 51.

In this manner, in the MOSFET 100 according to the first embodiment, owing to the presence of the outer peripheral wire layer 13 below the outer peripheral end portion of the source electrode 51 particularly liable to cause electric field concentration, electric field concentration at the outer peripheral end portion below the source electrode 51 can be reduced, and generation of aluminum hydroxide can be reduced.

Further, with the outer peripheral wire layer 13 being formed to extend 1 μm or longer on an outer peripheral side with respect to the outer peripheral end portion of the source electrode 51, electric field concentration can be effectively reduced around the outer peripheral end portion of the source electrode 51, and generation of aluminum hydroxide can be reduced.

Further, when the outer peripheral wire layer 13 is formed in the entire region below the outer peripheral end portion of the source electrode 51, electric field concentration can be reduced in the entire region below the outer peripheral end portion of the source electrode 51, and generation of aluminum hydroxide can be reduced.

Further, as in the MOSFET 105 illustrated in FIG. 8, by connecting the source electrode 51 and the outer peripheral wire layer 13 through the contact hole CH13 passing through the interlayer insulation film 14 to reach the outer peripheral wire layer 13 above the outer peripheral wire layer 13, the potential of the outer peripheral wire layer 13 can be made equal to the potential of the source electrode 51. With this, a potential difference generated between the source electrode 51 and the termination well region 2 is generated only inside the gate insulation film 12 and the field insulation film 4, and a potential difference in the interlayer insulation film 14 between the source electrode 51 and the outer peripheral wire layer 13 can be reduced. Therefore, electric field concentration below the outer peripheral end portion of the source electrode 51 can be more effectively reduced, and generation of aluminum hydroxide can be reduced.

Further, as in the MOSFET 106 illustrated in FIG. 9, by connecting the source electrode 51 and the outer peripheral wire layer 13 through the contact hole CH13 passing through the interlayer insulation film 14 to reach the outer peripheral wire layer 13 at a position of the outermost periphery of the source electrode 51, electric field concentration below the outer peripheral end portion of the source electrode 51 can be sufficiently reduced, and generation of aluminum hydroxide can be reduced.

As described above, in the MOSFET 100 according to the first embodiment and its modifications, generation of aluminum hydroxide can be reduced at the outer peripheral end portion of the source electrode 51. As a result, increase of a leakage current and air discharge due to cracks or peeling in the source electrode 51 and the front surface protective film 6 can be reduced, and insulation reliability can thus be enhanced.

<Manufacturing Method of Semiconductor Device>

Next, with reference to FIG. 11 to FIG. 18 being cross-sectional diagrams illustrating a manufacturing process in order, a manufacturing method of the MOSFET 100 according to the first embodiment will be described. Note that, in the following, description of a manufacturing method of the MOSFET 101 illustrated in FIG. 4 is used for description of the manufacturing method of the MOSFET 100.

First, the single crystal substrate 31 of low resistance containing relatively high concentration (n$^+$) of n-type impurity is prepared. The single crystal substrate 31 is a SiC substrate having a 4H polytype, and has an off-angle of 4 degrees or 8 degrees.

Figure 11:
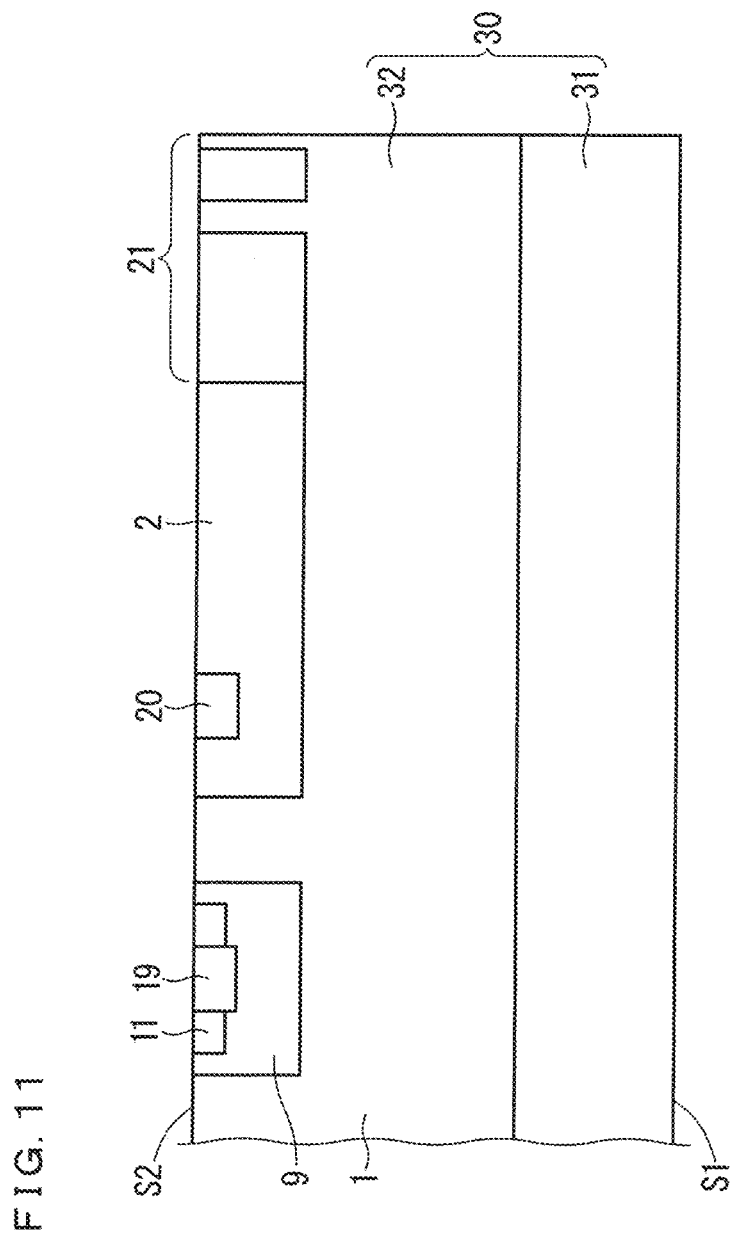
FIG. 11 is a partial cross-sectional diagram illustrating a manufacturing process of the semiconductor device according to the first embodiment of the present disclosure.

Next, on the single crystal substrate 31, SiC is epitaxially grown, and the epitaxial layer 32 of the n type having impurity concentration of $1 \times 10^{14}/cm^3$ or more and $1 \times 10^{17}/cm^3$ or less is formed. In this manner, the epitaxial substrate 30 illustrated in FIG. 11 is obtained.

Next, a process of forming an impurity region on the upper layer portion of the epitaxial layer 32 is repeated with a combination of formation of a resist mask through a photolithography process and an ion implantation process using the resist mask as an implantation mask. In this manner, as illustrated in FIG. 11, the termination well region 2, the element well region 9, the contact region 19, the high concentration region 20, the source region 11, and the low concentration well region 21 are formed on the upper layer portion of the epitaxial layer 32.

In ion implantation, nitrogen (N) or P is used as the n-type impurity, and Al or B is used as a p-type impurity. The element well region 9 and the termination well region 2 can be collectively formed in the same ion implantation process. Further, the contact region 19 and the high concentration region 20 of the termination well region 2 can be collectively formed in the same ion implantation process.

Impurity concentration of the element well region 9 is $1.0 \times 10^{18}/cm^3$ or more and $1.0 \times 10^{20}/cm^3$ or less.

Each of impurity concentration of the source region 11 and impurity concentration of the contact region 19 is higher than the impurity concentration of the element well region 9, and is, for example, $1.0 \times 10^{19}/cm^3$ or more and $1.0 \times 10^{21}/cm^3$ or less.

In the termination well region 2, in order to secure such an amount of impurities that hampers expansion of the depletion layer into the termination well region 2 in the off-state, a dose of the termination well region 2 is preferably $2.0 \times 10^{13}/cm^2$ or more, and is, for example, $5.0 \times 10^{13}/cm^2$.

A dose of the low concentration well region 21 is preferably $0.5 \times 10^{13}/cm^2$ or more and $5 \times 10^{13}/cm^2$ or less, and is, for example, $1.0 \times 10^{13}/cm^2$.

When the impurity is Al, implantation energy of ion implantation is, for example, 100 keV or more and 700 keV or less. In this case, impurity concentration of the low concentration well region 21 converted from the above dose [cm$^{-2}$] is $1 \times 10^{17}/cm^3$ or more and $1 \times 10^{19}/cm^3$ or less. Further, when the impurity is N, implantation energy of ion implantation is, for example, 20 keV or more and 300 keV or less.

Subsequently, with use of a thermal treatment device, annealing treatment is performed under a temperature of 1500° C. or higher. With this, the impurities added through the ion implantation are activated.

Figure 12:
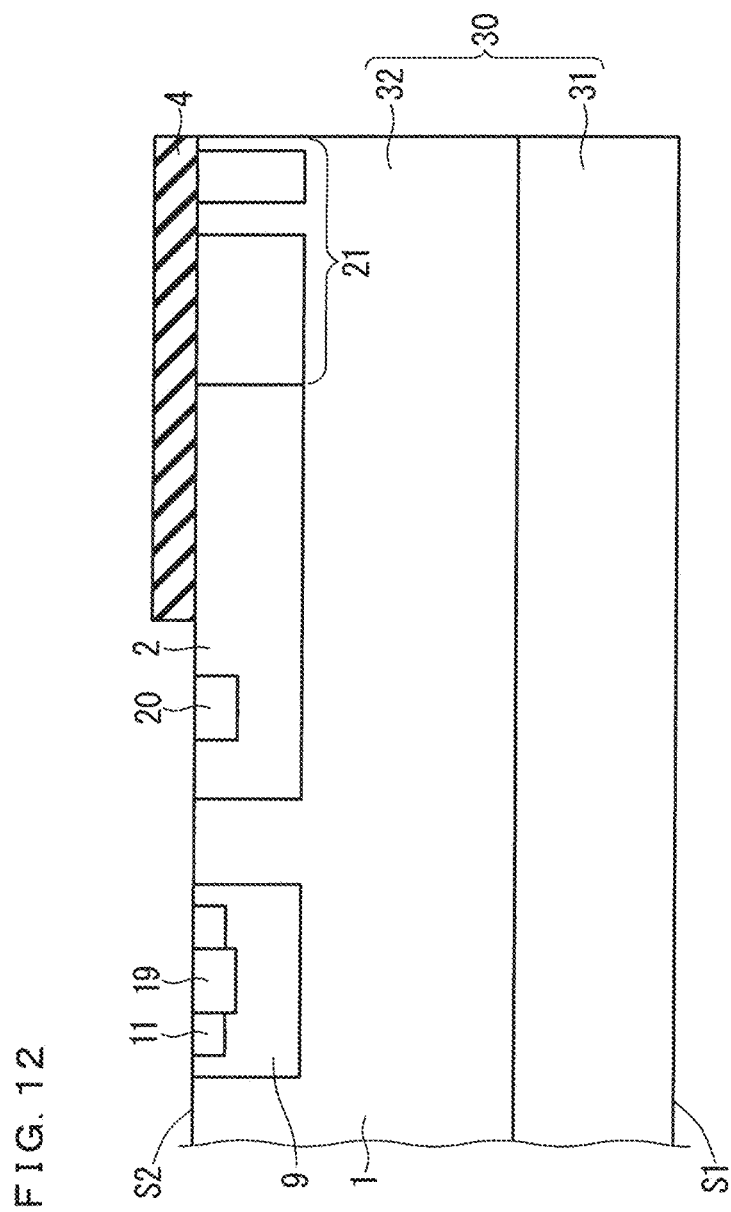
FIG. 12 is a partial cross-sectional diagram illustrating the manufacturing process of the semiconductor device according to the first embodiment of the present disclosure.

Next, for example, using a chemical vapor deposition (CVD) method, a SiO$_2$ film having a thickness of 0.5 μm or more and 2 μm or less is formed on the upper surface S2 of the epitaxial substrate 30. Then, the SiO$_2$ film is patterned through a photolithography process and an etching process. In this manner, as illustrated in FIG. 12, the field insulation film 4 is formed. In this case, the field insulation film 4 is patterned into such a shape that the field insulation film 4 covers a part of the termination well region 2 and extends beyond the end portion of the termination well region 2 to the outer peripheral side of the termination well region 2.

Figure 13:
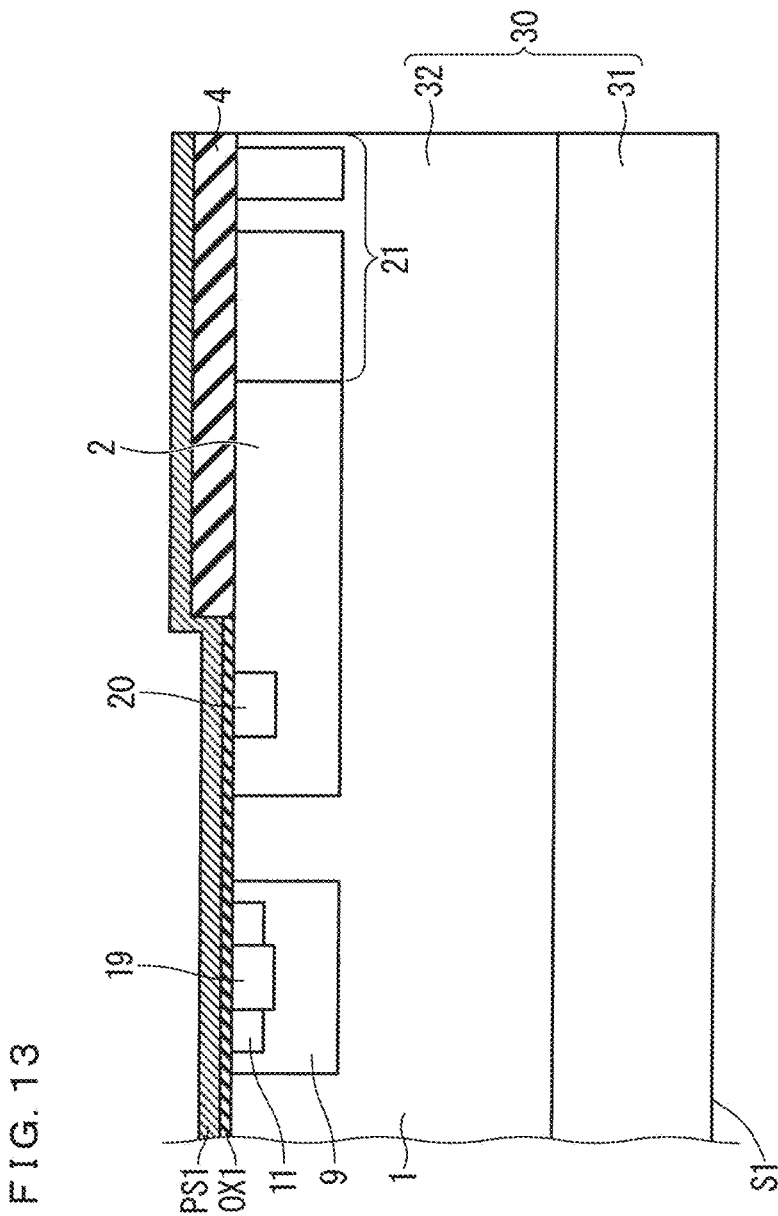
FIG. 13 is a partial cross-sectional diagram illustrating the manufacturing process of the semiconductor device according to the first embodiment of the present disclosure.

Next, in the process illustrated in FIG. 13, the upper surface of the epitaxial layer 32 not covered by the field insulation film 4 is thermally oxidized. In this manner, a SiO$_2$ film OX1 as the gate insulation film 12 is formed. Then, a polycrystalline silicon film PS1 having conductivity is formed on an upper surface of the SiO$_2$ film OX1 using a low pressure CVD method.

Figure 14:
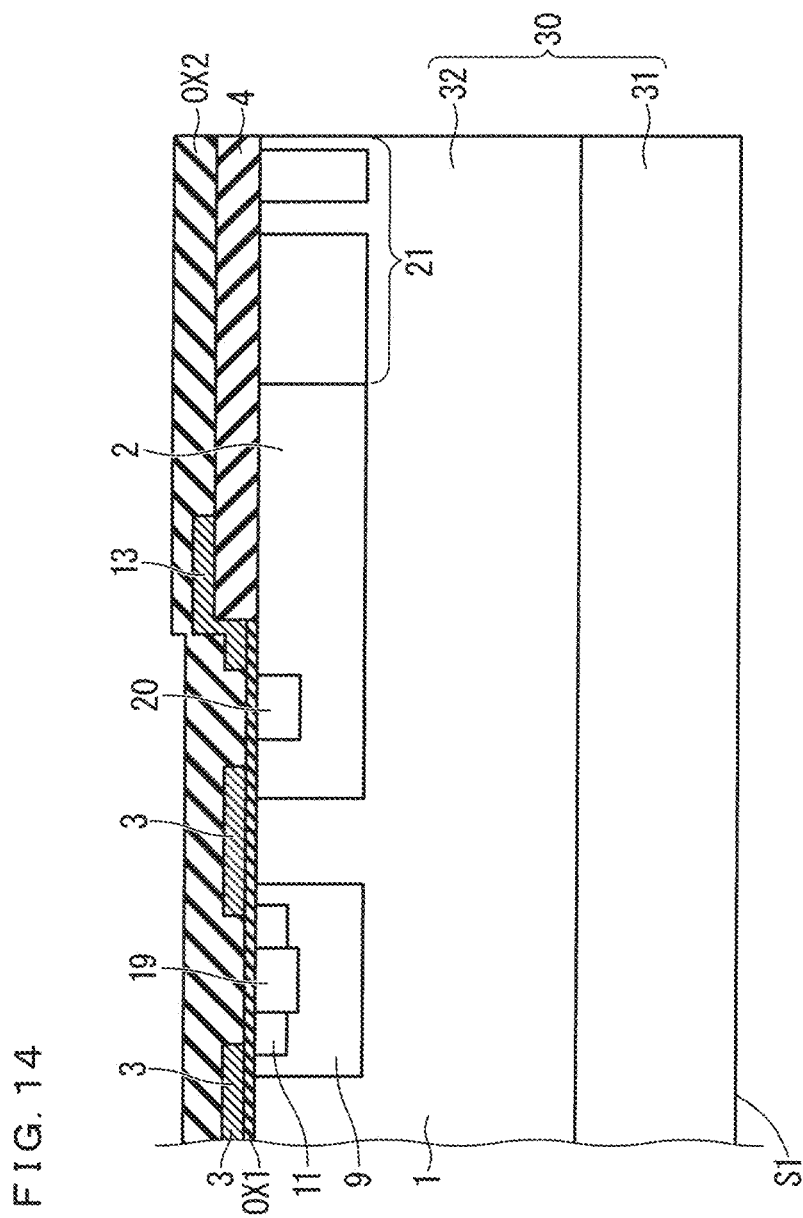
FIG. 14 is a partial cross-sectional diagram illustrating the manufacturing process of the semiconductor device according to the first embodiment of the present disclosure.

Next, in the process illustrated in FIG. 14, the polycrystalline silicon film PS1 is patterned through a photolithography process and an etching process. In this manner, the gate electrode 3 is formed. In this case, by forming a resist mask into a predetermined layout, the outer peripheral wire layer 13 can be simultaneously formed in the termination region. Subsequently, a SiO$_2$ film OX2 as the interlayer insulation film 14 is formed using a CVD method.

The outer peripheral wire layer 13 is formed such that a part or all of the outer peripheral wire layer 13 climbs onto the upper surface of the field insulation film 4, and is formed such that the outer peripheral end portion of the outer peripheral wire layer 13 is located on an inner peripheral side with respect to the outer peripheral end portion of the termination well region 2.

Note that the outer peripheral wire layer 13 is not limited to a polycrystalline silicon film, and can be formed by forming a metal film having an ionization tendency lower than that of the source electrode 51, such as titanium (Ti), nickel (Ni), and gold (Au), using a sputtering method, a vapor deposition method, or the like and then patterning the metal film.

Further, as in the MOSFET 102 illustrated in FIG. 5 and the MOSFET 103 illustrated in FIG. 6, the field insulation film 4 can be provided to extend to a position near the inner edge portion of the termination well region 2, and the gate electrode 3 led out to the outer region RO can be formed to climb onto the inner edge portion of the field insulation film 4.

Figure 15:
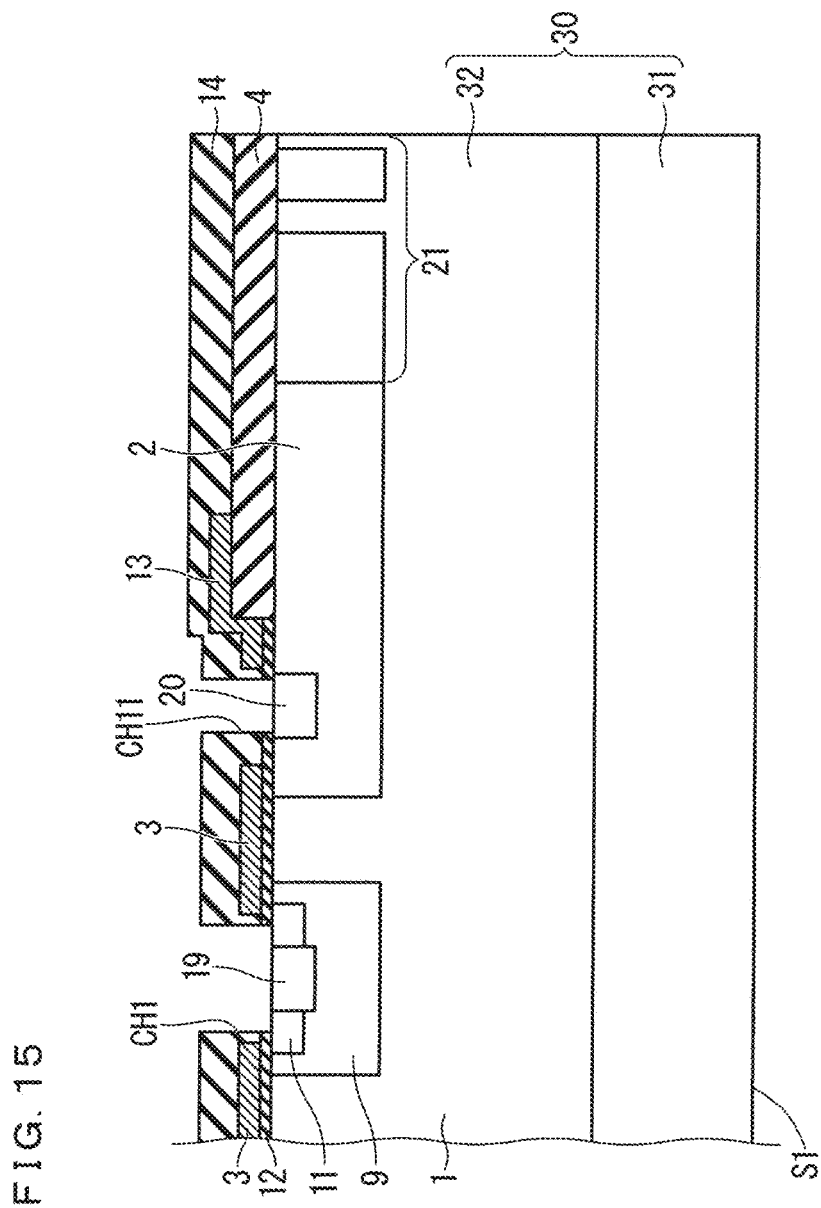
FIG. 15 is a partial cross-sectional diagram illustrating the manufacturing process of the semiconductor device according to the first embodiment of the present disclosure.

Next, in the process illustrated in FIG. 15, through a photolithography process and an etching process, the contact hole CH1 passing through the SiO$_2$ films OX2 and OX1 to reach the contact region 19 and the source region 11 and the contact hole CH11 passing through the SiO$_2$ films OX2 and OX1 to reach the high concentration region 20 are formed. With this, the SiO$_2$ film OX1 serves as the gate insulation film 12, and the SiO$_2$ film OX2 serves as the interlayer insulation film 14.

Note that, if the contact hole CH13 passing through the interlayer insulation film 14 to reach the outer peripheral wire layer 13 is formed on the outer peripheral side with respect to the contact hole CH11, the MOSFETs 105 and 106 illustrated in FIG. 8 and FIG. 9 can be obtained.

The interlayer insulation film 14 can be made of a boron phosphorus silicate glass (BPSG) obtained by doping B and P into SiO$_2$, or a multi-layer film containing SiO$_2$, SiN, BPSG, and the like. Being subjected to annealing treatment at 1000° C., for example, the BPSG obtains a shape with smooth level differences. This enhances embeddability of electrodes into the contact holes, which enables formation of a fine structure as well.

Figure 16:
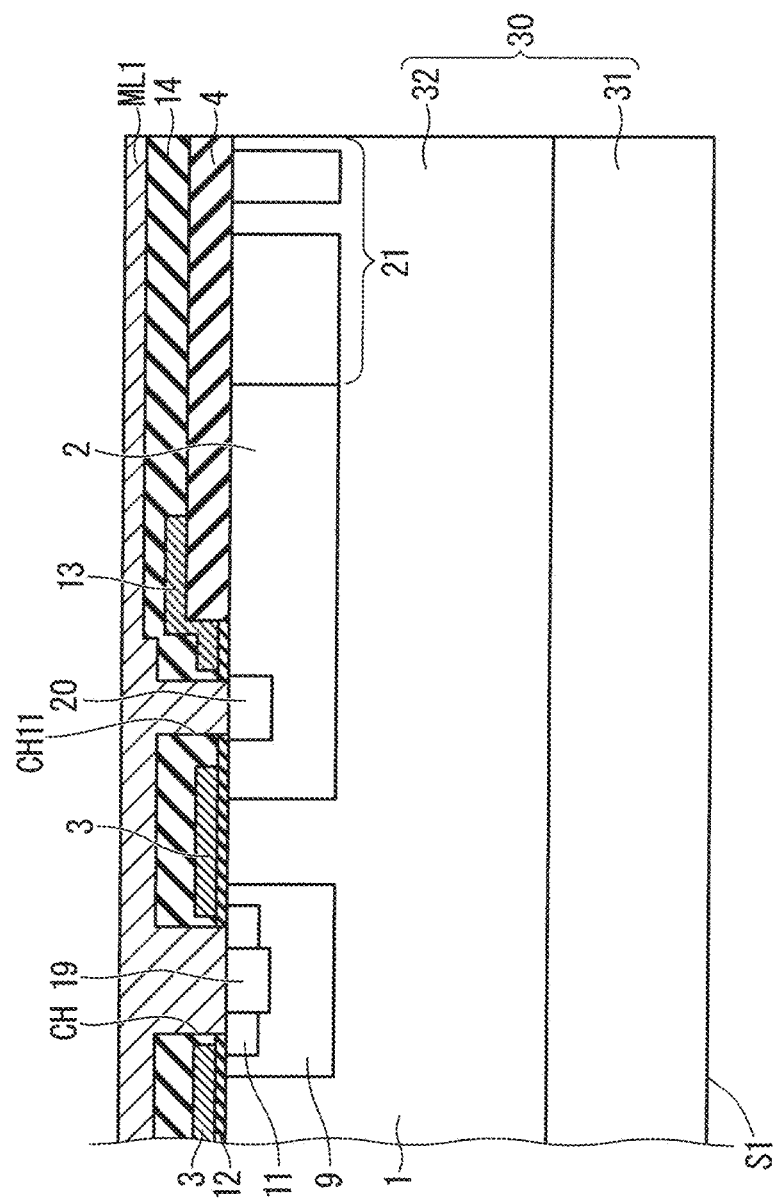
FIG. 16 is a partial cross-sectional diagram illustrating the manufacturing process of the semiconductor device according to the first embodiment of the present disclosure.

Next, in the process illustrated in FIG. 16, a material layer ML1 to be the front surface electrode 50, such as the source electrode 51 and the gate part 52 including the gate pad 52$p$ and the gate wire 52$w$, is formed on the upper surface S2 of the epitaxial substrate 30 using a sputtering method, a vapor deposition method, or the like.

Figure 17:
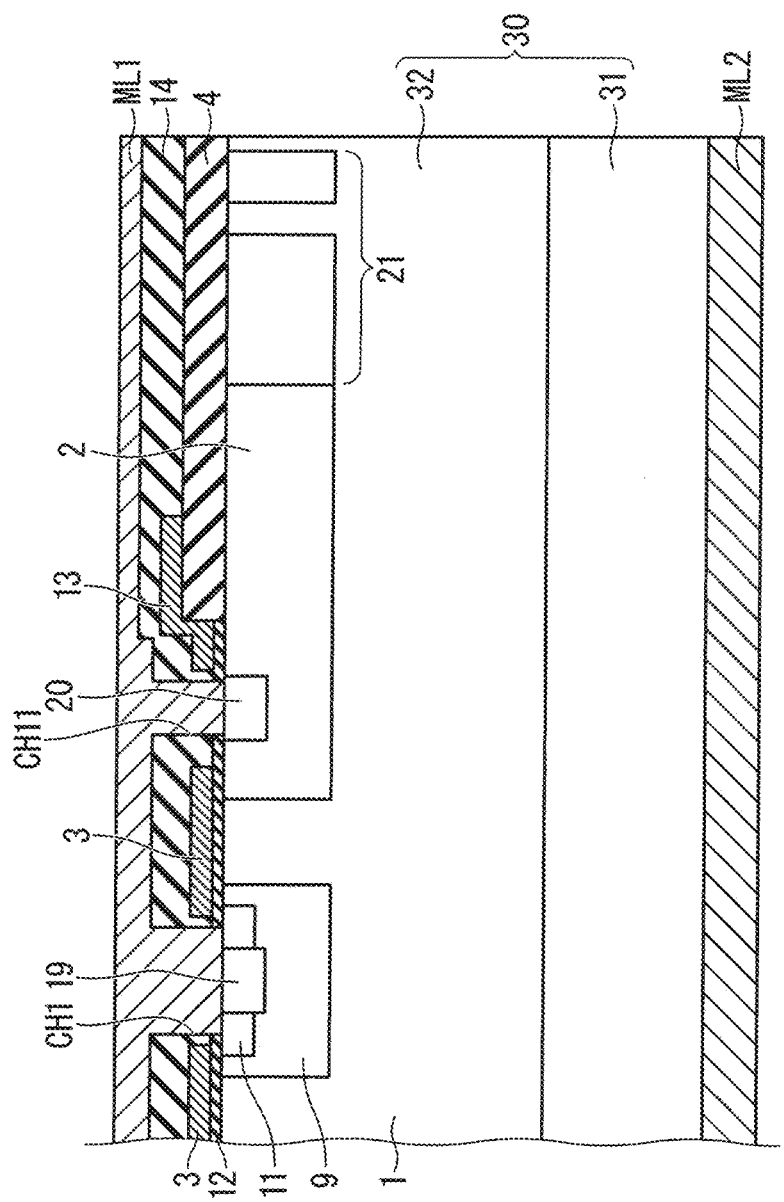
FIG. 17 is a partial cross-sectional diagram illustrating the manufacturing process of the semiconductor device according to the first embodiment of the present disclosure.

Further, in the process illustrated in FIG. 17, a material layer ML2 to be the back surface electrode 8 is formed on the lower surface S1 of the epitaxial substrate 30, using a method similar to that for the material layer ML1.

For formation of the material layer ML1, for example, a metal containing one or more of titanium (Ti), nickel (Ni), Al, copper (Cu), and gold (Au), an Al alloy such as Al-Si, or the like is used. For formation of the material layer ML2, for example, a metal containing one or more of Ti, Ni, Al, Cu, and Au, or the like is used. Note that, at a part where the material layer ML1 and the material layer ML2 come in contact with the epitaxial substrate 30, a silicide film can be formed in advance through thermal treatment. Note that formation of the back surface electrode 8 can be performed after all the processes end.

Figure 18:
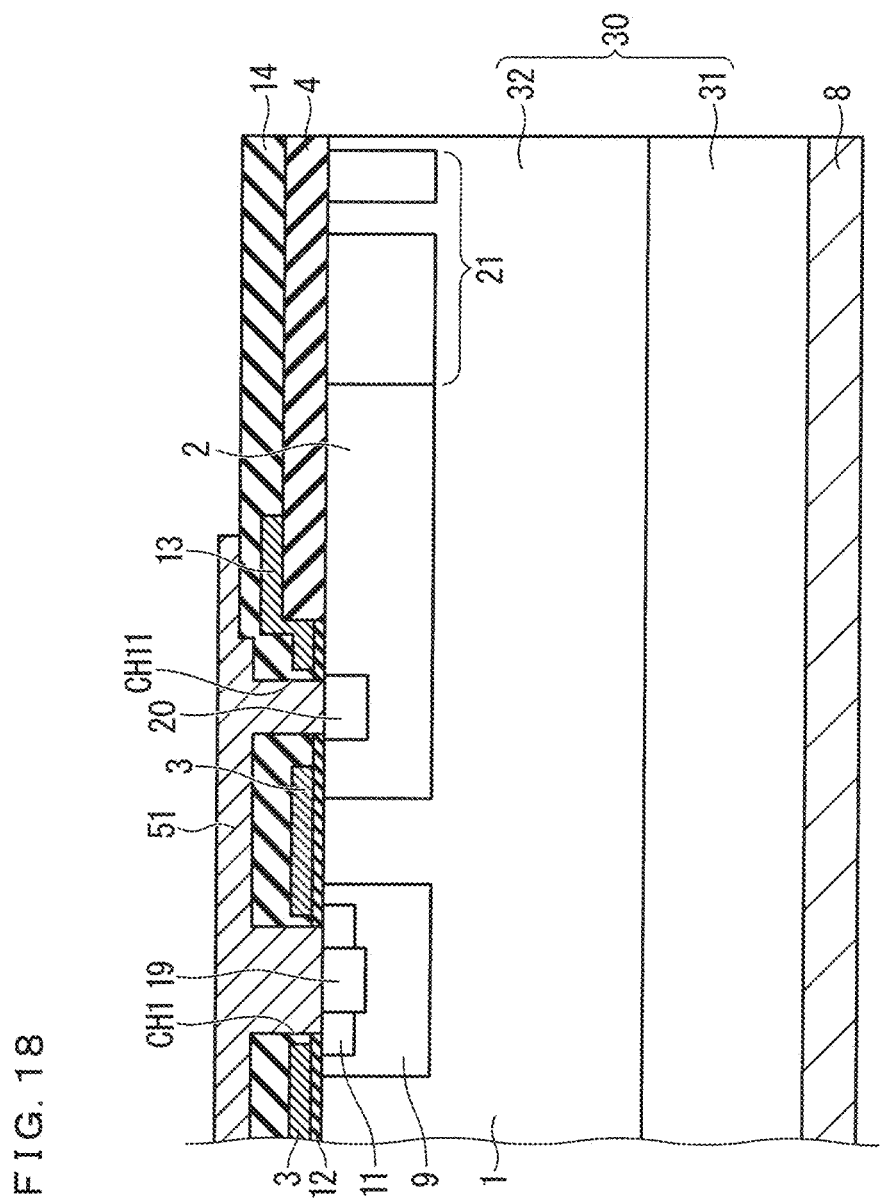
FIG. 18 is a partial cross-sectional diagram illustrating the manufacturing process of the semiconductor device according to the first embodiment of the present disclosure.

Next, in the process illustrated in FIG. 18, through a photolithography process and an etching process, the material layer ML1 is patterned to separate the source electrode 51 and the gate part 52 (including the gate pad 52$p$ and the gate wire 52$w$), and the front surface electrode 50 is thereby formed.

In this case, as illustrated in the cross-sectional diagram of FIG. 1, the source electrode 51 is formed such that the outer peripheral wire layer 13 is located below the outer peripheral end portion of the source electrode 51. Note that the outer peripheral wire layer 13 can be formed in not only the part of the line A-A of FIG. 2 but also in the entire region below the outer peripheral end portion of the source electrode 51.

Lastly, the front surface protective film 6 is formed to cover the end portion of the front surface electrode 50 and at least a part of the epitaxial substrate 30 in the outer region RO. In this manner, the MOSFET 101 illustrated in FIG. 4 is obtained. Note that, if formation of the low concentration well region 21 is omitted in the process described with reference to FIG. 11, the MOSFET 100 illustrated in FIG. 1 is obtained.

The front surface protective film 6 is processed into a desired shape through a polyimide application process, a photolithography process, and an etching process, for example. Alternatively, the front surface protective film 6 can be formed by depositing an SiN film using a CVD method and performing a photolithography process and an etching process.

As described above, according to the MOSFET 100 of the first embodiment, generation of aluminum hydroxide at the end portion of the source electrode 51 in the termination region is reduced, and cracks or peeling in the source electrode 51 and the front surface protective film 6 is reduced. As a result, increase of a leakage current and air discharge due to cracks or peeling in the source electrode 51 and the front surface protective film 6 can be reduced, and insulation reliability of the MOSFET 100 can thus be enhanced.

<Second Embodiment>

A configuration, an operation, and a manufacturing method of a semiconductor device according to a second embodiment will be described below. Note that, in the following description, the same configurations as those of the MOSFET 100 according to the first embodiment are denoted by the same reference signs, and redundant description will be omitted.

<Configuration of Semiconductor Device>

Figure 19:
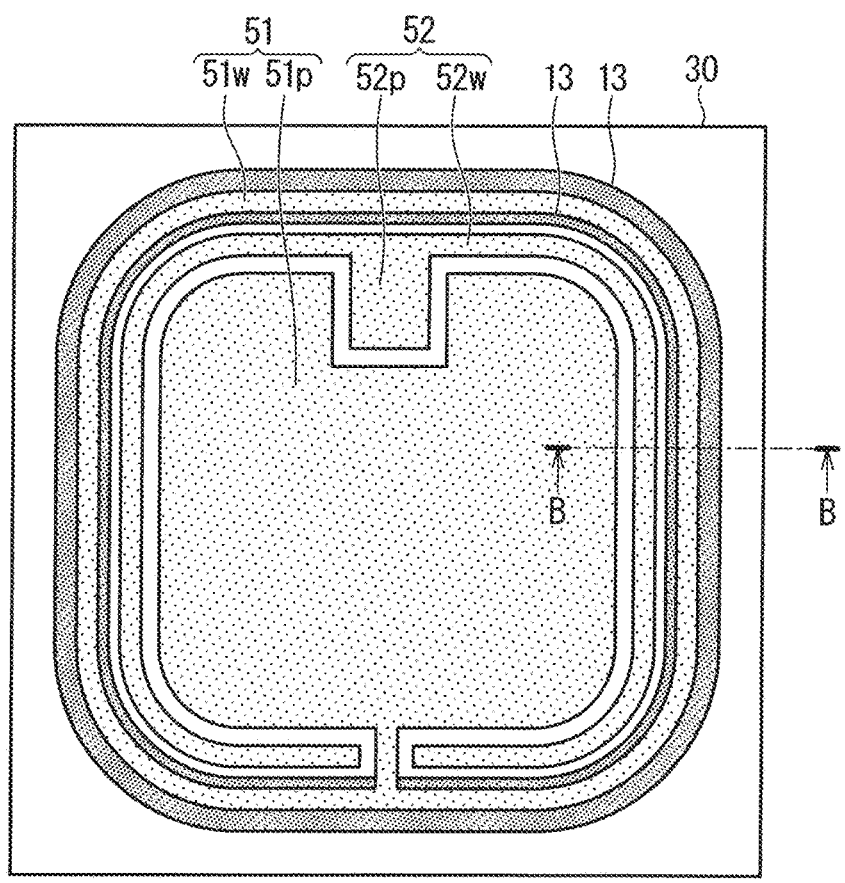
FIG. 19 is a plan view illustrating a configuration of a semiconductor device according to a second embodiment of the present disclosure.
Figure 20:
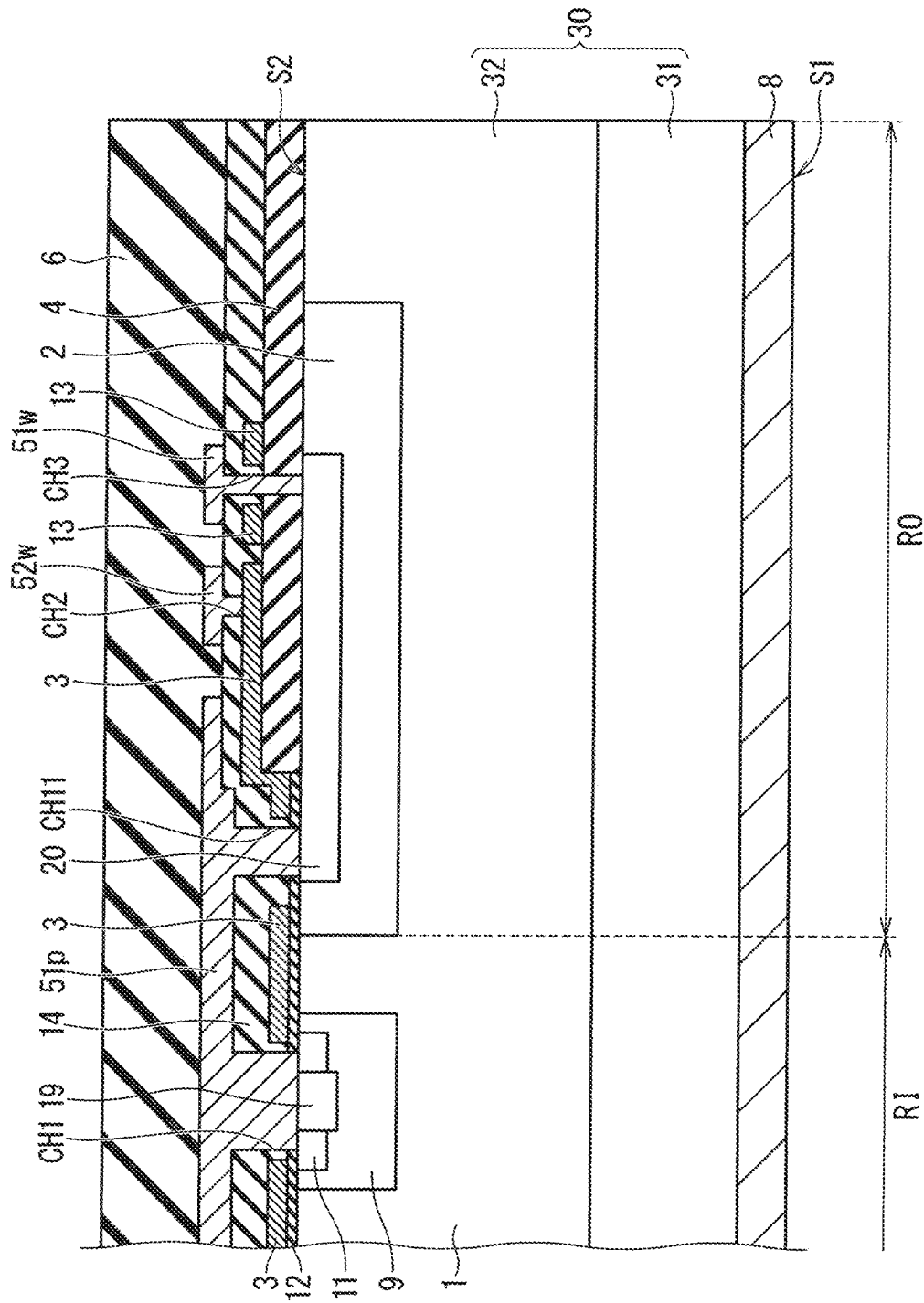
FIG. 20 is a partial cross-sectional diagram illustrating a configuration of the semiconductor device according to the second embodiment of the present disclosure.

FIG. 19 is a plan view illustrating a configuration of a MOSFET 200 being a semiconductor device according to the second embodiment. Further, FIG. 20 is a cross-sectional diagram taken along the line B-B as seen in a direction of the arrows in FIG. 19. Note that, in FIG. 19, for the sake of convenience, of an upper surface configuration of the MOSFET 200, a front surface protective film 6 (upper surface film) is omitted.

In the MOSFET 200 according to the second embodiment, as illustrated in FIG. 19 and FIG. 20, in the termination region, that is, the outer region RO, the gate wire 52$w$ connected to the gate pad 52$p$ is provided to surround a source pad 51$p$ except a portion in which the gate pad 52$p$ is formed in plan view. Further, a source wire 51$w$ connected to the source pad 51$p$ is provided to surround the gate pad 52$p$ and the gate wire 52$w$ in plan view. The source pad 51$p$ and the source wire 51$w$ constitute the source electrode 51, and the gate pad 52$p$ and the gate wire 52$w$ constitute the gate part 52.

As illustrated in FIG. 20, the high concentration region 20 of the termination well region 2 is provided to extend to a position below the source wire 51$w$, and the source wire 51$w$ is connected to form an ohmic contact or a Schottky contact with the high concentration region 20 through a contact hole CH3 passing through the field insulation film 4 and the interlayer insulation film 14 to reach the high concentration region 20 of the termination well region 2.

Further, as illustrated in FIG. 20, in the MOSFET 200, the field insulation film 4 is provided to extend to a position near an inner edge portion of the termination well region 2, the gate electrode 3 led out to the outer region RO is formed to climb onto an inner edge portion of the field insulation film 4 and further extend to an outer peripheral side, and the gate wire 52$w$ is connected to form an ohmic contact or a Schottky contact with the gate electrode 3 through a contact hole CH2 passing through the interlayer insulation film 14 to reach the gate electrode 3.

The gate pad 52$p$ and the gate wire 52$w$ need not necessarily be connected directly, and can be connected electrically via the gate electrode 3, for example. Similarly, the source pad 51$p$ and the source wire 51$w$ need not necessarily be connected directly, and can be connected electrically via the outer peripheral wire layer 13, for example.

In the MOSFET 200 according to the second embodiment, as illustrated in FIG. 20, the outer peripheral wire layer 13 is formed below an outer peripheral end portion of the source wire 51$w$. Further, the outer peripheral wire layer 13 is formed to extend 1 μm or longer on an outer side with respect to a position below the outer peripheral end portion of the source wire 51$w$. Note that the outer peripheral wire layer 13 can be formed in the entire region below the outer peripheral end portion of the source wire 51$w$.

Further, in the MOSFET 200 according to the second embodiment, as illustrated in FIG. 20, the outer peripheral wire layer 13 is formed below an inner peripheral end portion of the source wire 51$w$. Further, the outer peripheral wire layer 13 is formed to extend 1 μm or longer on an inner side with respect to a position below the inner peripheral end portion of the source wire 51w. Note that the outer peripheral wire layer 13 can be formed in the entire region below the inner peripheral end portion of the source wire 51w.

<First Modification>

Figure 21:
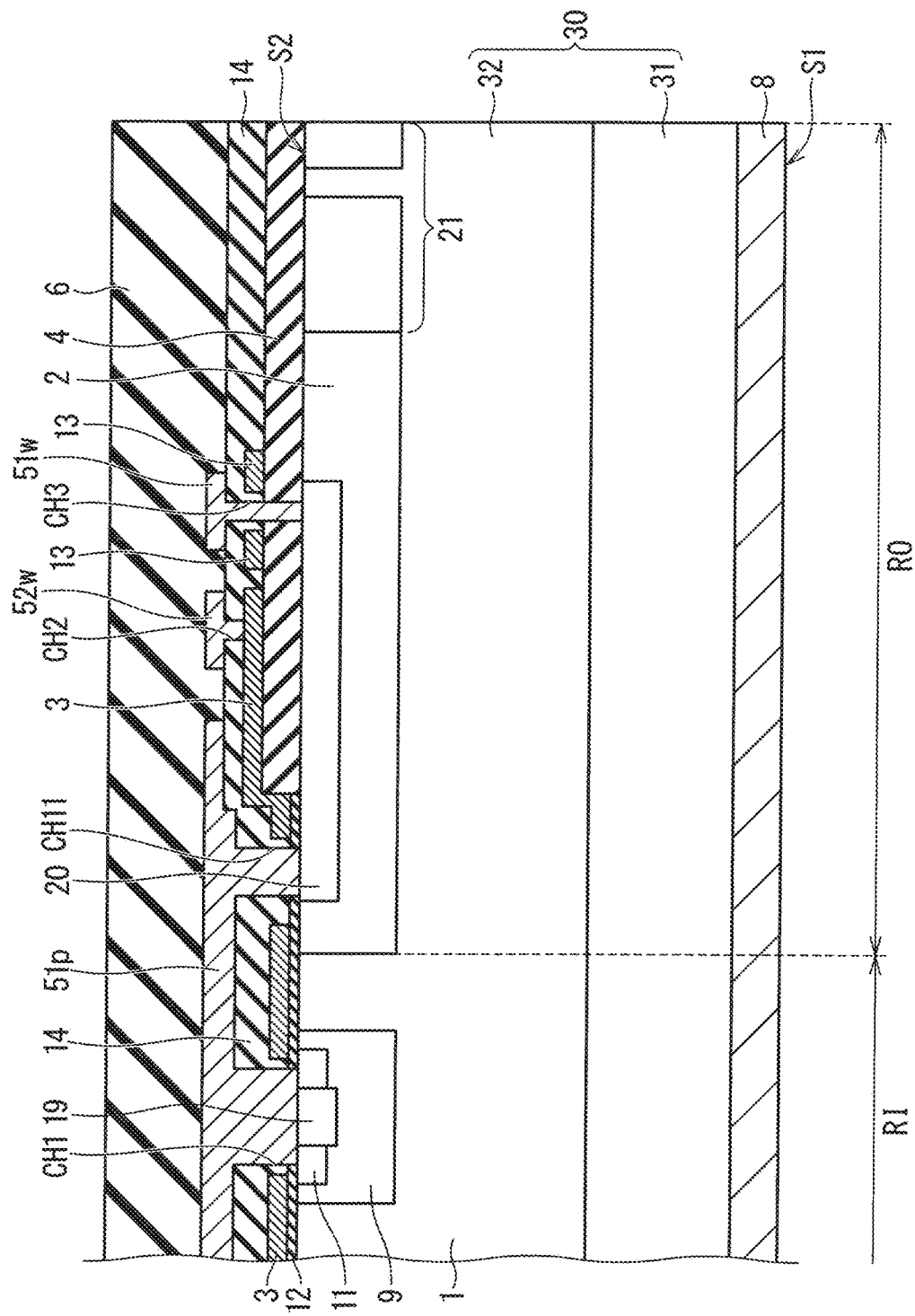
FIG. 21 is a partial cross-sectional diagram illustrating a configuration of a modification of the semiconductor device according to the second embodiment of the present disclosure.

FIG. 21 is a cross-sectional diagram illustrating a configuration of a MOSFET 201 as a modification of the second embodiment. Note that, in FIG. 21, the same configurations as those of the MOSFET 200 described with reference to FIG. 20 are denoted by the same reference signs, and redundant description will be omitted.

As illustrated in FIG. 21, the MOSFET 201 includes a low concentration well region 21 of the p type, which is provided in an upper layer portion of the drift layer 1 on an outer peripheral side with respect to the termination well region 2. The low concentration well region 21 is provided as multiple frame-like regions surrounding the termination well region 2 in plan view, but is not limited to such multiple regions and may be a single frame-like region. Impurity concentration of the low concentration well region 21 is equal to or lower than impurity concentration of the termination well region 2.

<Second Modification>

Further, as in the MOSFET 105 as a modification of the first embodiment illustrated in FIG. 8, a contact hole CH13 passing through the interlayer insulation film 14 to reach the outer peripheral wire layer 13 can be provided above the outer peripheral wire layer 13 on the field insulation film 4, and the source wire 51w and the outer peripheral wire layer 13 can be connected through the contact hole CH13. Note that the number of contact holes CH13 is not limited to one, and a plurality of contact holes CH13 may be provided.

By employing such a configuration, electric field strength of the source wire 51w is more effectively reduced, and deposition of an insulator is reduced. Accordingly, cracks and peeling in the source wire 51w and the front surface protective film 6 can be reduced, and insulation reliability of the semiconductor device can thus be enhanced.

Further, as in the MOSFET 106 as a modification of the first embodiment illustrated in FIG. 9, the contact hole CH13 passing through the interlayer insulation film 14 to reach the outer peripheral wire layer 13 can be provided above the outer peripheral wire layer 13, and outermost periphery of the source wire 51w and the outer peripheral wire layer 13 can be connected through the contact hole CH13.

By employing such a configuration, electric field strength of the outermost periphery of the source wire 51w is more effectively reduced, and deposition of an insulator is reduced. Accordingly, cracks and peeling in the source wire 51w and the front surface protective film 6 can be reduced, and insulation reliability of the semiconductor device can thus be enhanced.

Figure 22:
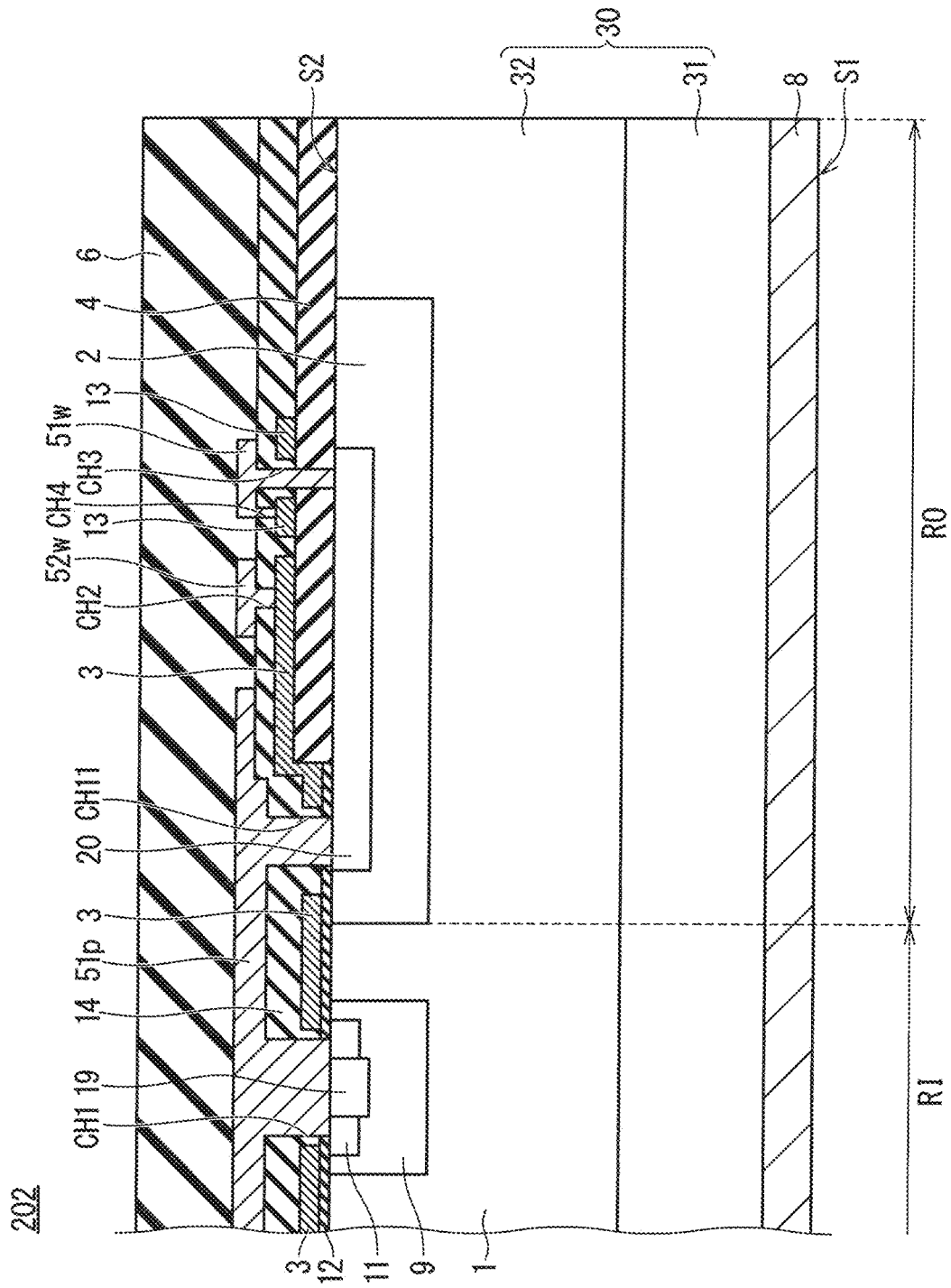
FIG. 22 is a partial cross-sectional diagram illustrating a configuration of a modification of the semiconductor device according to the second embodiment of the present disclosure.

FIG. 22 is a cross-sectional diagram illustrating a configuration of a MOSFET 202 as a modification of the second embodiment. Note that, in FIG. 22, the same configurations as those of the MOSFET 200 described with reference to FIG. 20 are denoted by the same reference signs, and redundant description will be omitted.

As illustrated in FIG. 22, in the MOSFET 202, a contact hole CH4 (third contact hole) passing through the interlayer insulation film 14 to reach the outer peripheral wire layer 13 is provided at a position of the inner peripheral end portion of the source wire 51w, and the source wire 51w and the outer peripheral wire layer 13 are connected at innermost periphery of the source wire 51w.

By employing such a configuration, electric field strength of the inner peripheral end portion of the source wire 51w can be more effectively reduced and deposition of an insulator can be reduced. Consequently, cracks and peeling in the source electrode and the upper surface film can be reduced, and insulation reliability of the semiconductor device can thus be enhanced.

Note that the contact hole CH4 can be provided at positions of the inner peripheral end portion and the outer peripheral end portion of the source wire 51w.

<Operation of Semiconductor Device>

Next, an operation of the MOSFET 200 according to the second embodiment described with reference to FIG. 19 and FIG. 20 will be described.

In the MOSFET 200 according to the second embodiment as well, similarly to the MOSFET according to the first embodiment, there are separate operations for the "on-state" being a state in which a positive voltage at a threshold or higher is applied to the gate electrode 3 and the "off-state" being a state in which a voltage lower than the threshold is applied to the gate electrode 3.

In the off-state, in the semiconductor device that uses SiC having a particularly high electric field strength or the like as a material, when an end portion of an electrode material is located at a position where an upper surface of the epitaxial layer 32 is depleted, the high electric field is generated also at the end portion of the electrode material, which may lead to breakdown of the electrode material. Thus, in the MOSFET 200 according to the second embodiment, usually, the impurity concentration of the termination well region 2 is set to such impurity concentration that does not cause depletion inside the termination well region 2 below the source electrode 51 and the gate part 52.

Here, a case is considered in which the MOSFET 100 enters the off-state under high humidity. Sealing resin provided to cover a semiconductor chip may contain moisture. For example, when the front surface protective film 6 (upper surface film) is made of a resin material having high absorbency, such as polyimide, under high humidity, the front surface protective film 6 may contain much moisture, and the moisture may reach upper surfaces of the epitaxial layer 32 and the source electrode 51. Further, when the front surface protective film 6 is made of a material having high humidity resistance, such as SiN, cracks may be liable to be formed in the front surface protective film 6 due to a stress and the like caused during a process, and the epitaxial layer 32 and the source electrode 51 may be exposed to moisture through the cracks.

In such a state, due to a voltage applied to the MOSFET 200 in the off-state, an end portion of the epitaxial layer 32 acts as an anode, and the source electrode 51 acts as a cathode in the termination region. Near the source electrode 51 to act as a cathode, concentration of hydroxide ions is increased as described in the first embodiment. The hydroxide ions chemically react with the source electrode 51. For example, when the source electrode 51 is made of aluminum, aluminum may turn into aluminum hydroxide.

In the MOSFET 200 according to the second embodiment, the source wire 51w is closer to the end portion of the epitaxial layer 32 to act as an anode than the source pad 51p, and thus aluminum hydroxide is liable to be generated in the source wire 51w.

The reaction between aluminum and hydroxide ions are accelerated according to surrounding electric field strength. Inside the semiconductor layer, a potential gradient is generated in a depleted region, and thus in the MOSFET 200, a potential gradient along the upper surface S2 is generated in a region in which the depletion layer reaches an upper surface of the epitaxial substrate 30. The potential gradient is also formed in the field insulation film 4 and the interlayer insulation film 14 formed on the upper surface S2 of the epitaxial layer 32, and thus electric fields are generated around the outer peripheral end portion of the source wire 51w. Consequently, when electric field strength at the outer peripheral end portion of the source wire 51w reaches a certain value or higher, generation reaction of aluminum hydroxide is caused, and the reaction is accelerated along with increase of the electric field strength.

Further, electric fields are generated around the inner peripheral end portion of the source wire 51w due to a potential difference between the source wire 51w and the termination well region 2 and a potential difference between the source wire 51w and the gate wire 52w. Consequently, when electric field strength at the inner peripheral end portion of the source wire 51w reaches a certain value or higher, generation reaction of aluminum hydroxide is caused, and the reaction is accelerated along with increase of the electric field strength.

When aluminum hydroxide is generated on a surface of the source wire 51w as described above, cracks or peeling in the source wire 51w and the front surface protective film 6 is caused due to cubical expansion, and cavities are formed in the upper surface of the interlayer insulation film 14. A flow of an excessive leakage current due to entrance of moisture into the cavities and air discharge in the cavities may lead to breakdown of the MOSFET 100.

In contrast, in the MOSFET 200 according to the second embodiment, as illustrated in the cross-sectional diagram of FIG. 20, the outer peripheral end portion of the source wire 51w is located on an inner peripheral side with respect to an outer peripheral end portion of the termination well region 2, and thus electric field strength around the source wire 51w is reduced.

Here, by setting the impurity concentration of the termination well region 2 to a certain value or higher, the depletion layer scarcely ever expands into the termination well region 2, and electric field strength around the source wire 51w can be effectively reduced. Therefore, generation of aluminum hydroxide can be effectively reduced.

Further, as in the MOSFET 201 illustrated in FIG. 21, by providing the low concentration well region 21 in an outer peripheral portion of the termination well region 2, electric field strength around the source wire 51w can be effectively reduced and electric field strength of the epitaxial layer 32 around the outer peripheral end portion of the termination well region 2 can be reduced. Therefore, the avalanche voltage of the MOSFET 200 can be increased.

Further, in the MOSFET 200 according to the second embodiment, as illustrated in the cross-sectional diagram of FIG. 20, the outer peripheral wire layer 13 is formed below the outer peripheral end portion of the source wire 51w, and the outer peripheral wire layer 13 is formed below the inner peripheral end portion of the source wire 51w. The outer peripheral wire layer 13 has a potential between the source wire 51w and the termination well region 2, and by bringing away a region to have the potential on an outer peripheral side with respect to the outer peripheral end portion of the source wire 51w and an inner peripheral side with respect to the inner peripheral end portion thereof, electric field concentration due to a potential difference between the source wire 51w and the termination well region 2 is reduced around the outer peripheral end portion and the inner peripheral end portion of the source wire 51w.

In this manner, in the MOSFET 200 according to the second embodiment, owing to the presence of the outer peripheral wire layer 13 below the outer peripheral end portion and the inner peripheral end portion of the source wire 51w particularly liable to cause electric field concentration, electric field concentration below the outer peripheral end portion of the source wire 51w and below the inner peripheral end portion thereof can be reduced, and generation of aluminum hydroxide can be reduced. Further, with the outer peripheral wire layer 13 being formed to extend 1 µm or longer on an outer peripheral side with respect to the outer peripheral end portion of the source wire 51w and 1 µm or longer on an inner peripheral side with respect to the inner peripheral end portion thereof, electric field concentration can be effectively reduced around the outer peripheral end portion and the inner peripheral end portion of the source wire 51w, and generation of aluminum hydroxide can be reduced.

Further, in the MOSFET 105 as a modification of the first embodiment illustrated in FIG. 8, by providing the contact hole CH13 passing through the interlayer insulation film 14 to reach the outer peripheral wire layer 13 above the outer peripheral wire layer 13 on the field insulation film 4 and connecting the source wire 51w and the outer peripheral wire layer 13 through the contact hole CH13, the potential of the outer peripheral wire layer 13 can be made equal to the potential of the source electrode 51. With this, a potential difference generated between the source wire 51w and the termination well region 2 is generated only inside the gate insulation film 12 and the field insulation film 4, and a potential difference in the interlayer insulation film 14 between the source wire 51w and the outer peripheral wire layer 13 can be reduced. Therefore, electric field concentration at the outer peripheral end portion below the source wire 51w can be more effectively reduced, and generation of aluminum hydroxide can be reduced.

Further, as in the MOSFET 106 illustrated in FIG. 9, by connecting the source electrode 51 and the outer peripheral wire layer 13 through the contact hole CH13 passing through the interlayer insulation film 14 to reach the outer peripheral wire layer 13 at a position of the outermost periphery of the source wire 51w, electric field concentration below the outer peripheral end portion of the source electrode 51 can be sufficiently reduced, and generation of aluminum hydroxide can be reduced.

As described above, in the MOSFET 100 according to the first embodiment and its modifications, generation of aluminum hydroxide can be reduced at the outer peripheral end portion of the source electrode 51. As a result, increase of a leakage current and air discharge due to cracks or peeling in the source electrode 51 and the front surface protective film 6 can be reduced, and insulation reliability can thus be enhanced.

Further, as in the MOSFET 106 as a modification of the first embodiment illustrated in FIG. 9, the outermost periphery of the source wire 51w and the outer peripheral wire layer 13 can be connected through the contact hole CH13 passing through the interlayer insulation film 14 to reach the outer peripheral wire layer 13 above the outer peripheral wire layer 13. This configuration and a configuration in which the innermost periphery of the source wire 51w and the outer peripheral wire layer 13 are connected through the contact hole CH4 passing through the interlayer insulation film 14 to reach the outer peripheral wire layer 13 at a position of the inner peripheral end portion of the source wire 51w as in the MOSFET 202 as a modification of the second embodiment illustrated in FIG. 22 can be combined together.

In this manner, with the source wire 51w and the outer peripheral wire layer 13 being connected through the contact hole at the outermost periphery and the innermost periphery of the source wire 51w, electric field concentration at the outer peripheral end portion and the inner peripheral end portion below the source wire 51w can be sufficiently reduced, and generation of aluminum hydroxide can be reduced.

As described above, in the MOSFET 200 according to the second embodiment, generation of aluminum hydroxide at the end portion of the source wire 51w is reduced. As a result, increase of a leakage current and air discharge due to cracks or peeling in the source wire 51w and the front surface protective film 6 can be reduced, and insulation reliability can thus be enhanced.

<Manufacturing Method of Semiconductor Device>

Next, with reference to FIG. 23 to FIG. 31 being cross-sectional diagrams illustrating a manufacturing process in order, a manufacturing method of the MOSFET 200 according to the second embodiment will be described. Note that, in the following, description of a manufacturing method of the MOSFET 201 illustrated in FIG. 21 is used for description of the manufacturing method of the MOSFET 200. Note that description of the same processes as those in the manufacturing method of the MOSFET 100 according to the first embodiment described with reference to FIG. 1 to FIG. 18 will be omitted as appropriate.

Figure 23:
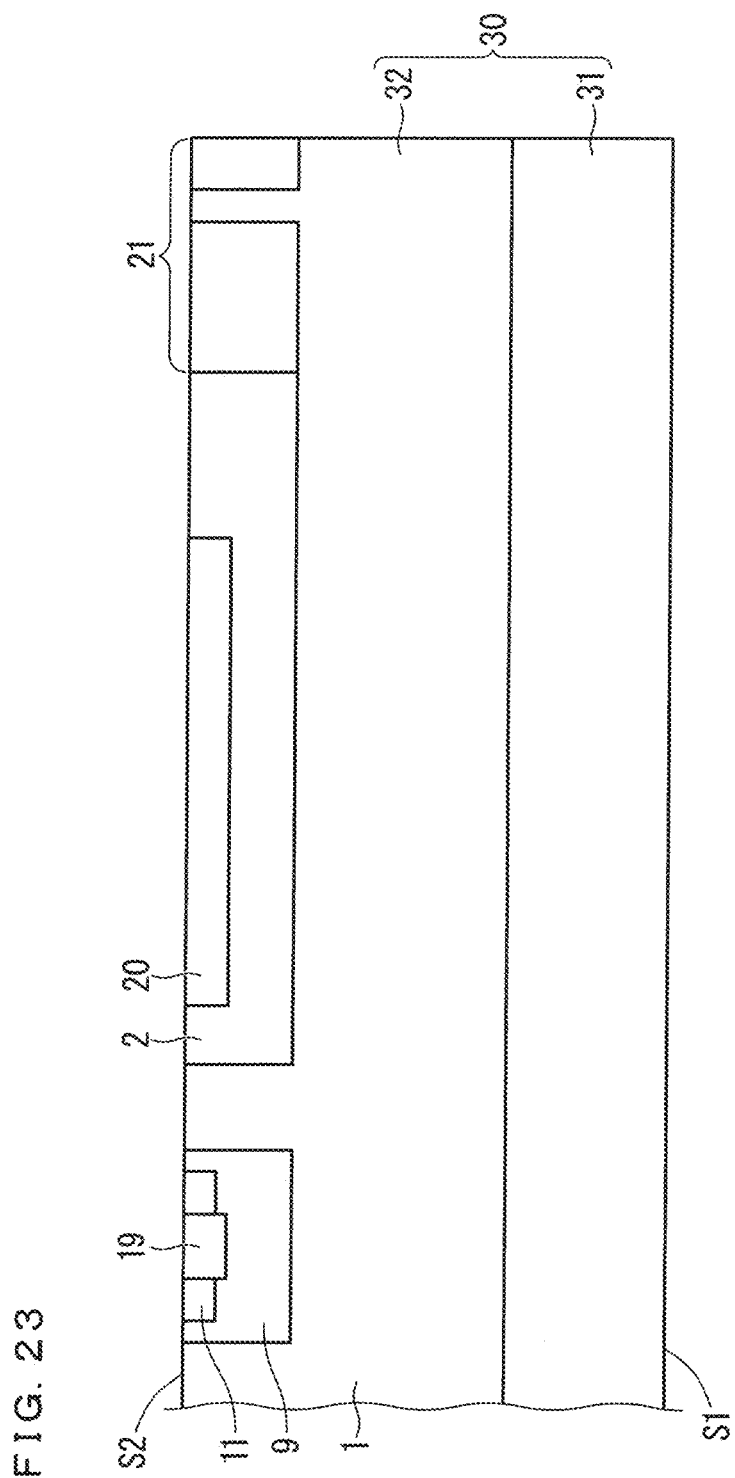
FIG. 23 is a partial cross-sectional diagram illustrating a manufacturing process of the semiconductor device according to the second embodiment of the present disclosure.

First, the single crystal substrate 31 of low resistance containing relatively high concentration (n$^+$) of n-type impurity is prepared, and on the single crystal substrate 31, SiC is epitaxially grown, and the epitaxial layer 32 is formed. In this manner, the epitaxial substrate 30 illustrated in FIG. 23 is obtained.

Subsequently, a process of forming an impurity region on the upper layer portion of the epitaxial layer 32 is repeated with a combination of formation of a resist mask through a photolithography process and an ion implantation process using the resist mask as an implantation mask. In this manner, as illustrated in FIG. 23, the termination well region 2, the element well region 9, the contact region 19, the high concentration region 20, the source region 11, and the low concentration well region 21 are formed on the upper layer portion of the epitaxial layer 32.

Figure 24:
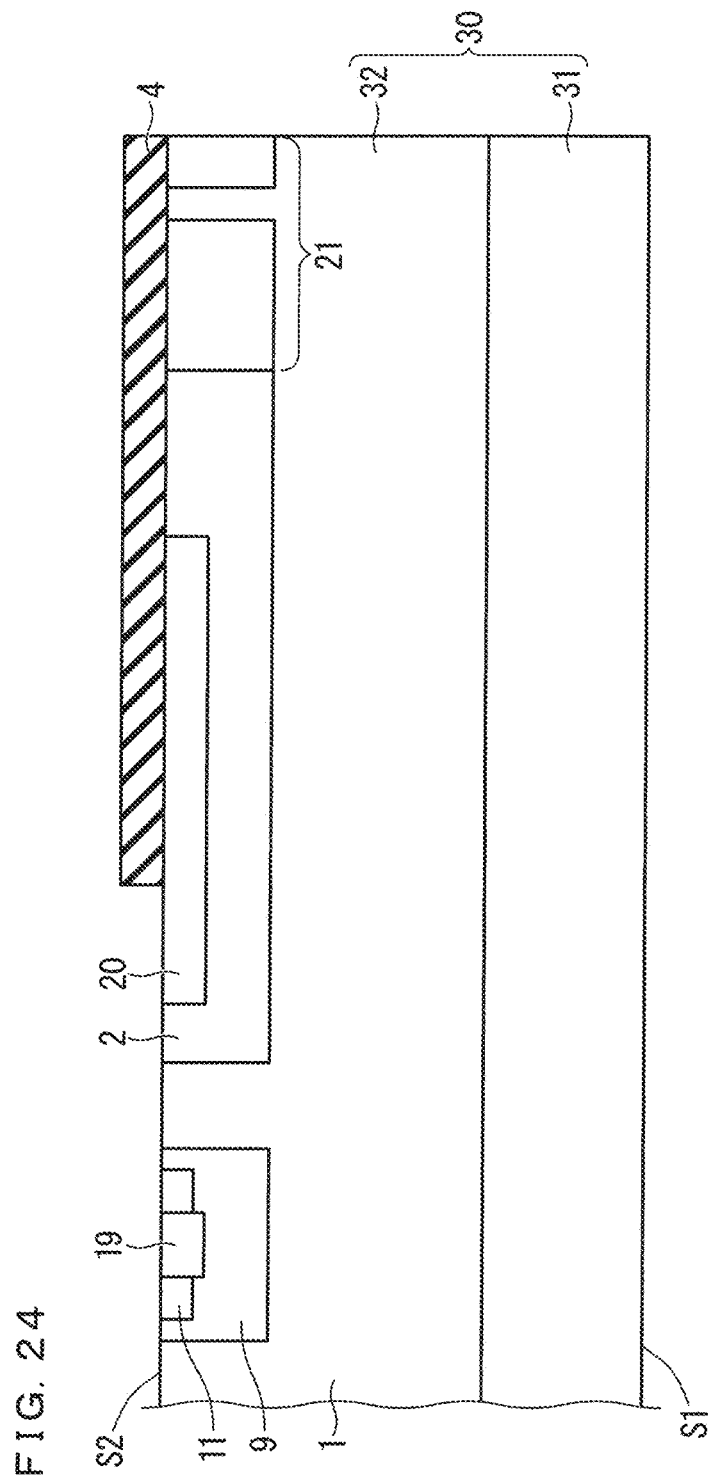
FIG. 24 is a partial cross-sectional diagram illustrating the manufacturing process of the semiconductor device according to the second embodiment of the present disclosure.

Next, a SiO$_2$ film is formed on the upper surface S2 of the epitaxial substrate 30 using a CVD method, and the SiO$_2$ film is patterned through a photolithography process and an etching process. In this manner, the field insulation film 4 is formed as illustrated in FIG. 24. In this case, the field insulation film 4 is patterned into such a shape that the field insulation film 4 covers a part of the termination well region 2 and extends beyond the end portion of the termination well region 2 to the outer peripheral side of the termination well region 2.

Figure 25:
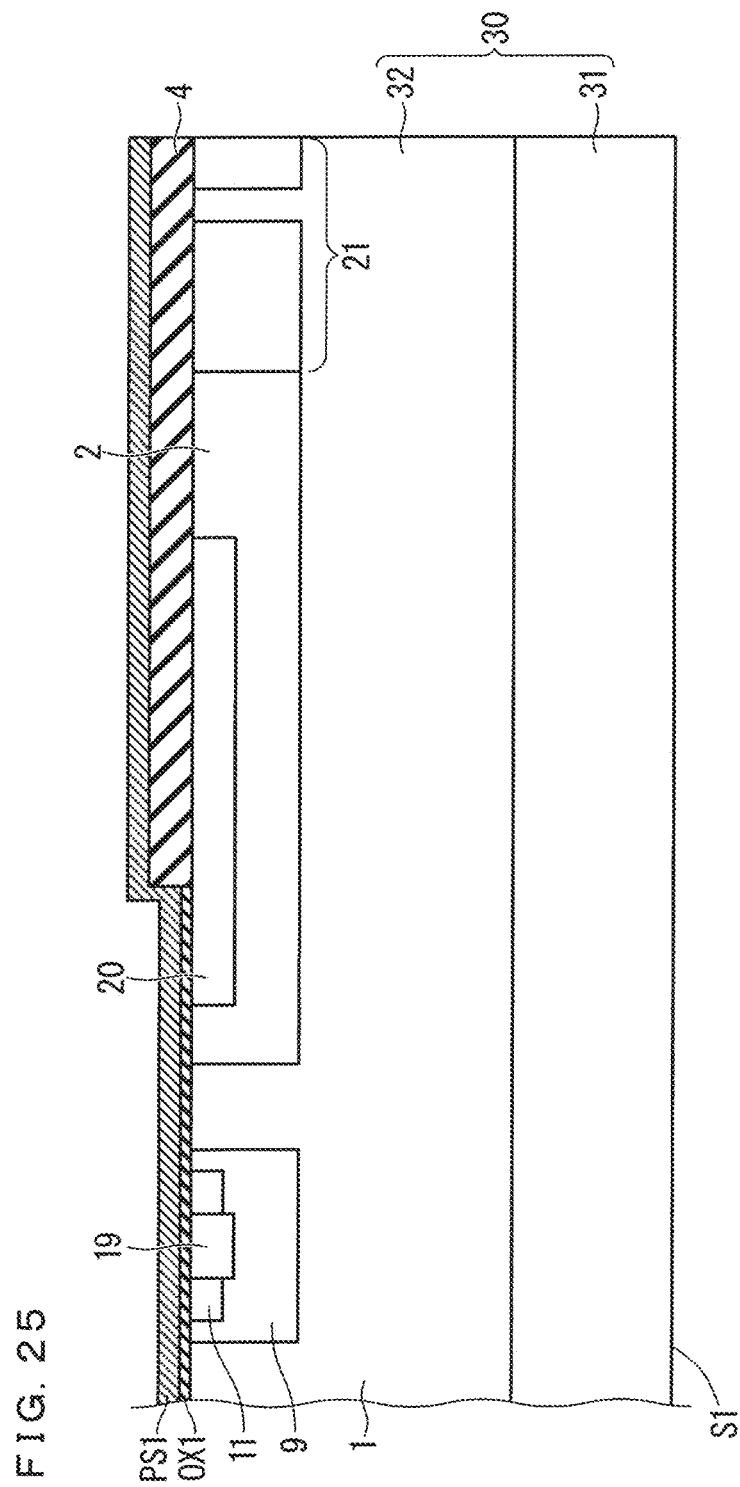
FIG. 25 is a partial cross-sectional diagram illustrating the manufacturing process of the semiconductor device according to the second embodiment of the present disclosure.

Next, in the process illustrated in FIG. 25, the upper surface of the epitaxial layer 32 not covered by the field insulation film 4 is thermally oxidized. In this manner, a SiO$_2$ film OX1 as the gate insulation film 12 is formed. Subsequently, a polycrystalline silicon film PS1 having conductivity is formed on an upper surface of the SiO$_2$ film OX1 using a low pressure CVD method.

Figure 26:
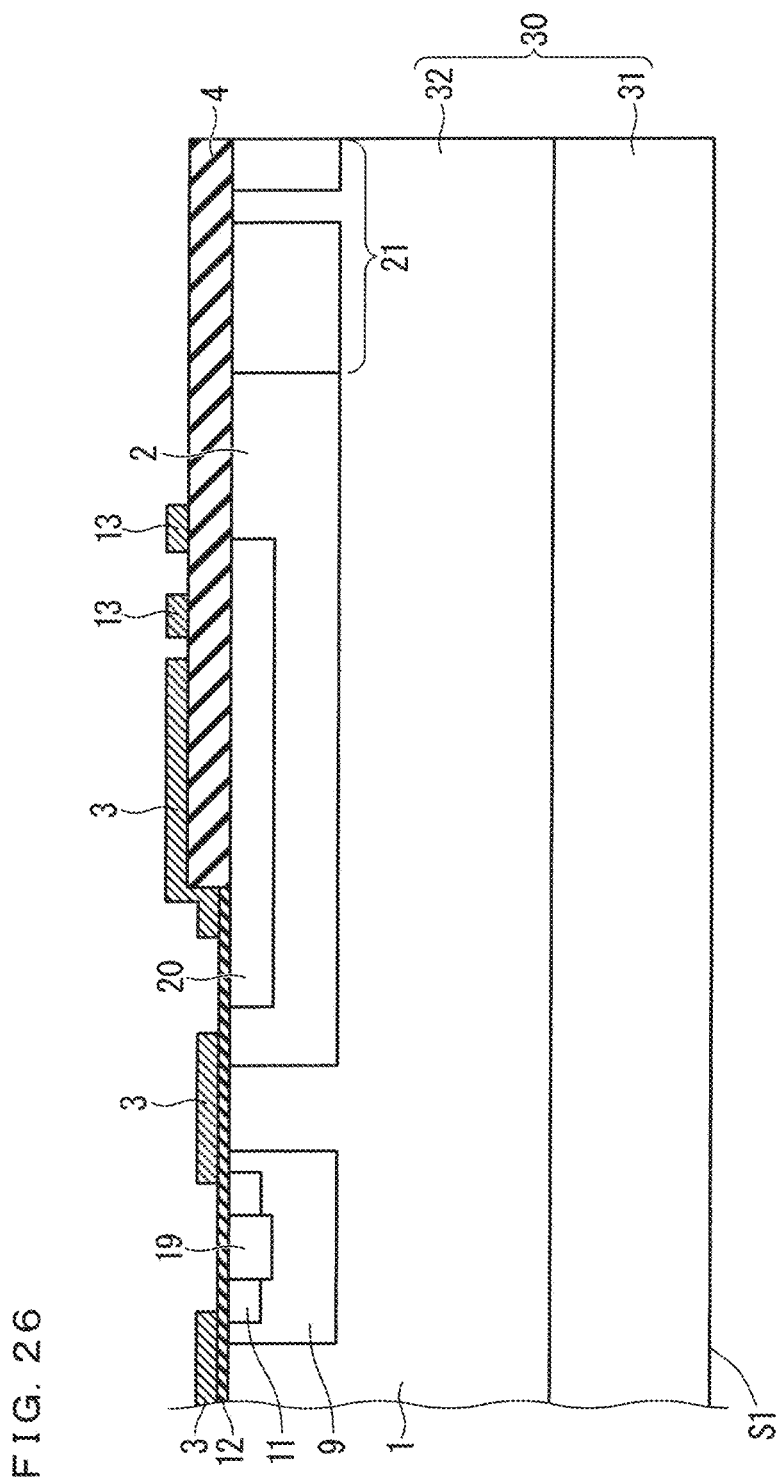
FIG. 26 is a partial cross-sectional diagram illustrating the manufacturing process of the semiconductor device according to the second embodiment of the present disclosure.

Next, in the process illustrated in FIG. 26, the polycrystalline silicon film PS1 is patterned through a photolithography process and an etching process. In this manner, the gate electrode 3 is formed. In this case, by forming a resist mask into a predetermined layout, the outer peripheral wire layer 13 is simultaneously formed in the termination region. The outer peripheral wire layer 13 is provided on an outer peripheral side with respect to the gate electrode 3 formed such that a part thereof climbs onto the upper surface of the field insulation film 4, and is formed such that the outer peripheral end portion thereof is located on an inner peripheral side with respect to the outer peripheral end portion of the termination well region 2.

Figure 27:
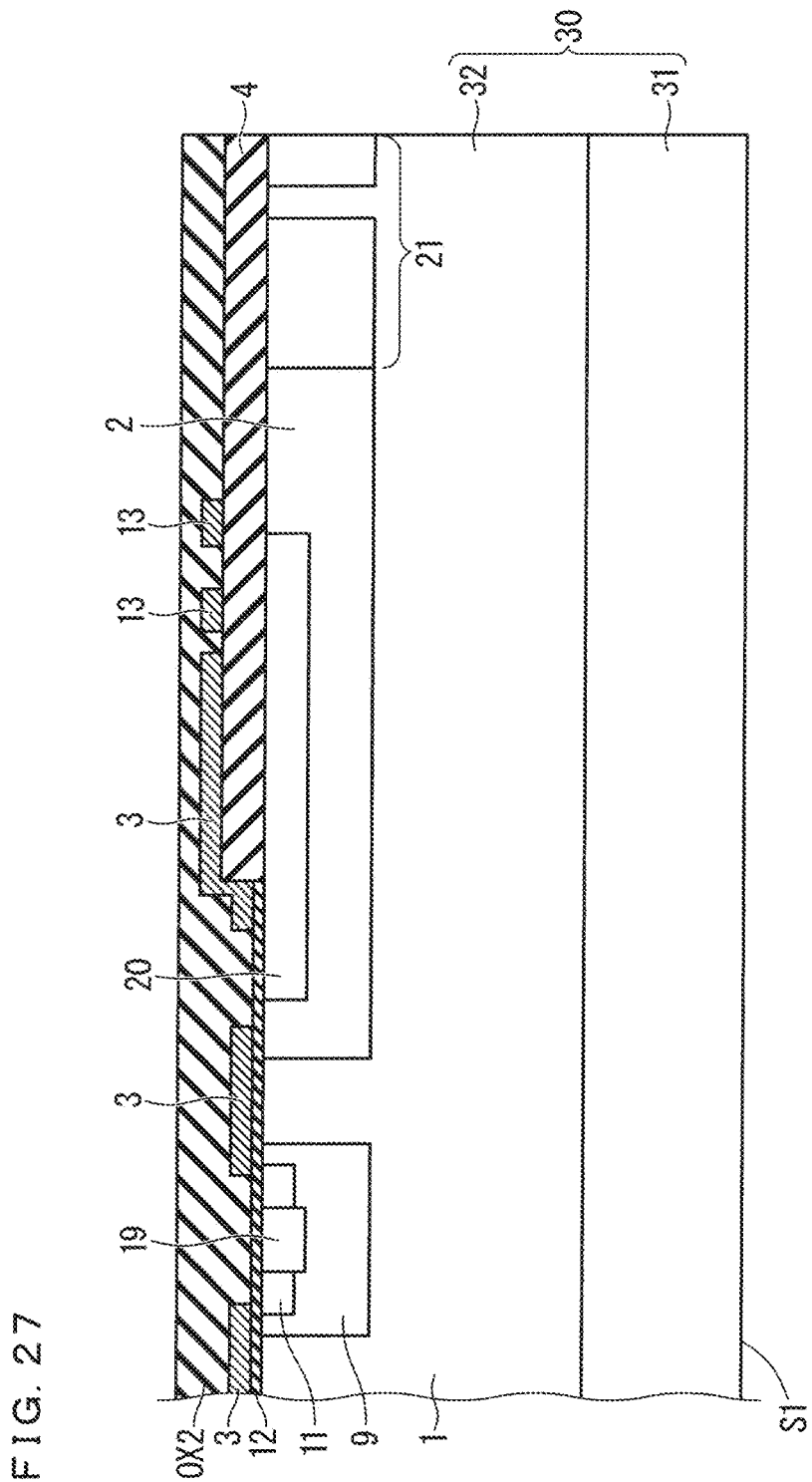
FIG. 27 is a partial cross-sectional diagram illustrating the manufacturing process of the semiconductor device according to the second embodiment of the present disclosure.

Next, in the process illustrated in FIG. 27, a SiO$_2$ film OX2 as the interlayer insulation film 14 is formed using a CVD method.

Figure 28:
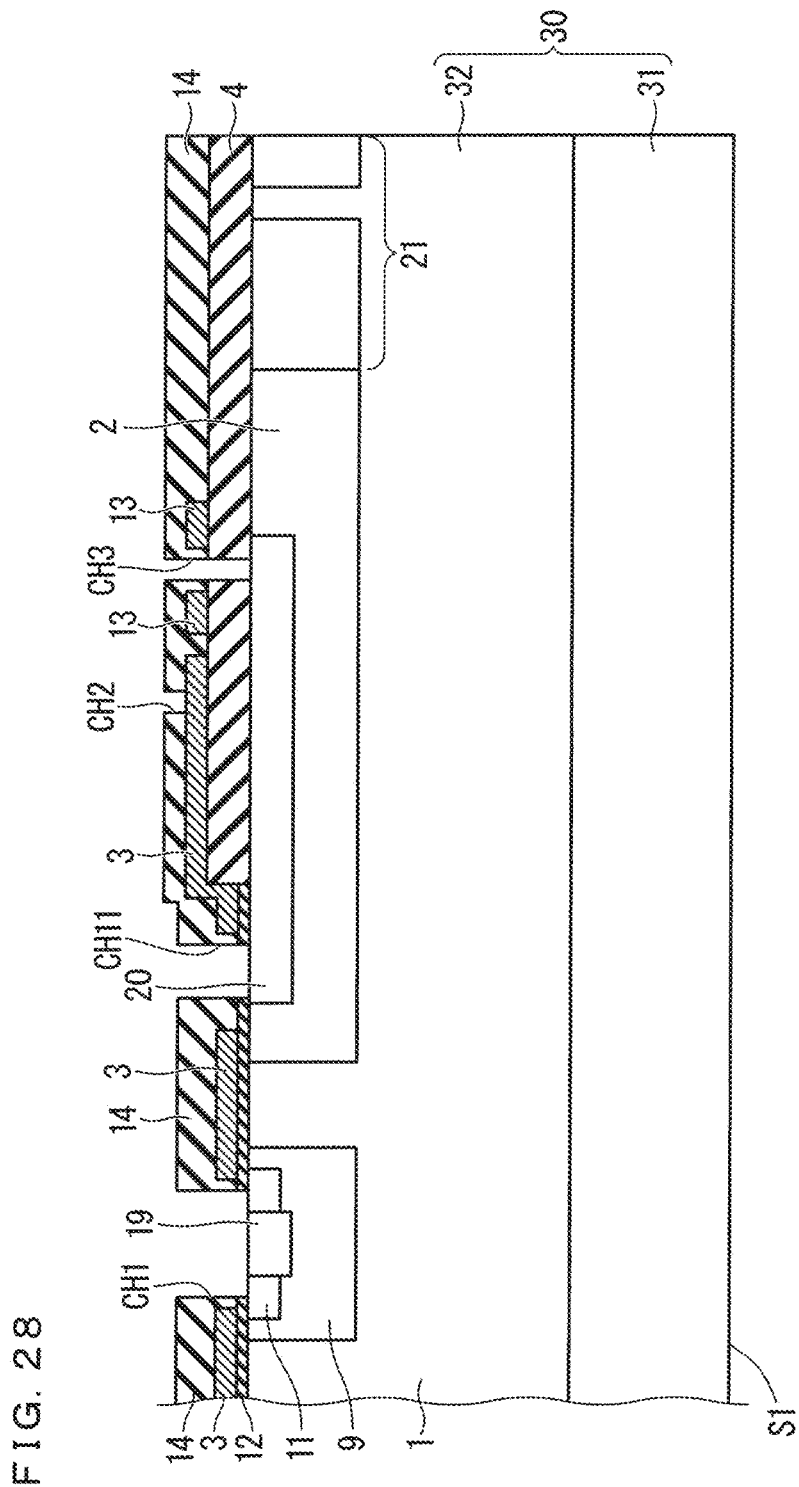
FIG. 28 is a partial cross-sectional diagram illustrating the manufacturing process of the semiconductor device according to the second embodiment of the present disclosure.

Next, in the process illustrated in FIG. 28, through a photolithography process and an etching process, the contact hole CH1 passing through the SiO2 films OX2 and OX1 to reach the contact region 19 and the source region 11 and the contact hole CH11 passing through the SiO$_2$ films OX2 and OXI to reach the high concentration region 20 are formed. Simultaneously, on an outer peripheral side with respect to the contact hole CH11, the contact hole CH2 passing through the interlayer insulation film 14 to reach the gate electrode 3 and the contact hole CH3 passing through the interlayer insulation film 14 and the field insulation film 4 to reach the high concentration region 20 are formed. With this, the SiO$_2$ film OX1 serves as the gate insulation film 12, and the SiO$_2$ film OX2 serves as the interlayer insulation film 14.

Figure 29:
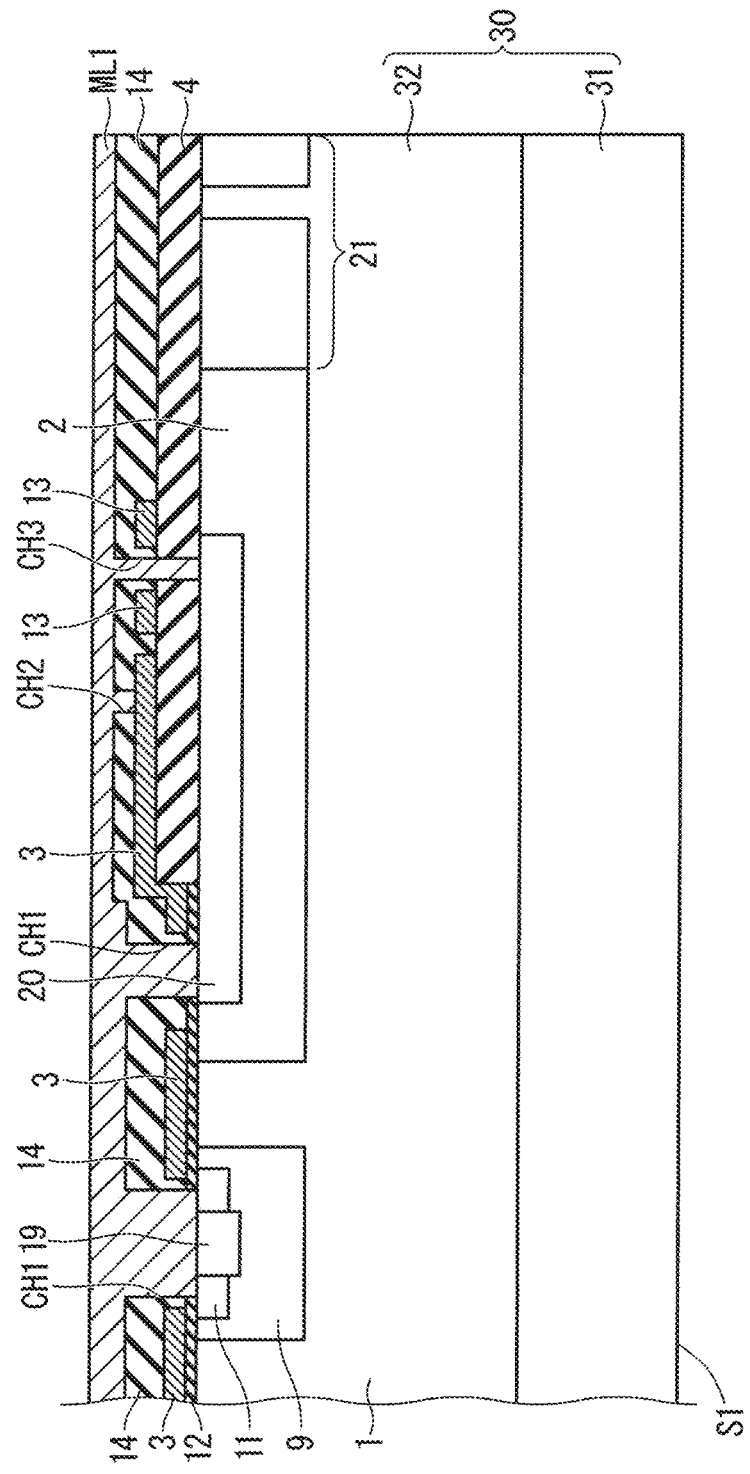
FIG. 29 is a partial cross-sectional diagram illustrating the manufacturing process of the semiconductor device according to the second embodiment of the present disclosure.

Next, in the process illustrated in FIG. 29, a material layer ML1 to be the front surface electrode 50, such as the source electrode 51 including the source pad 51p and the source wire 51w and the gate part 52 including the gate pad 52p and the gate wire 52w, is formed on the upper surface S2 of the epitaxial substrate 30 using a sputtering method, a vapor deposition method, or the like.

Figure 30:
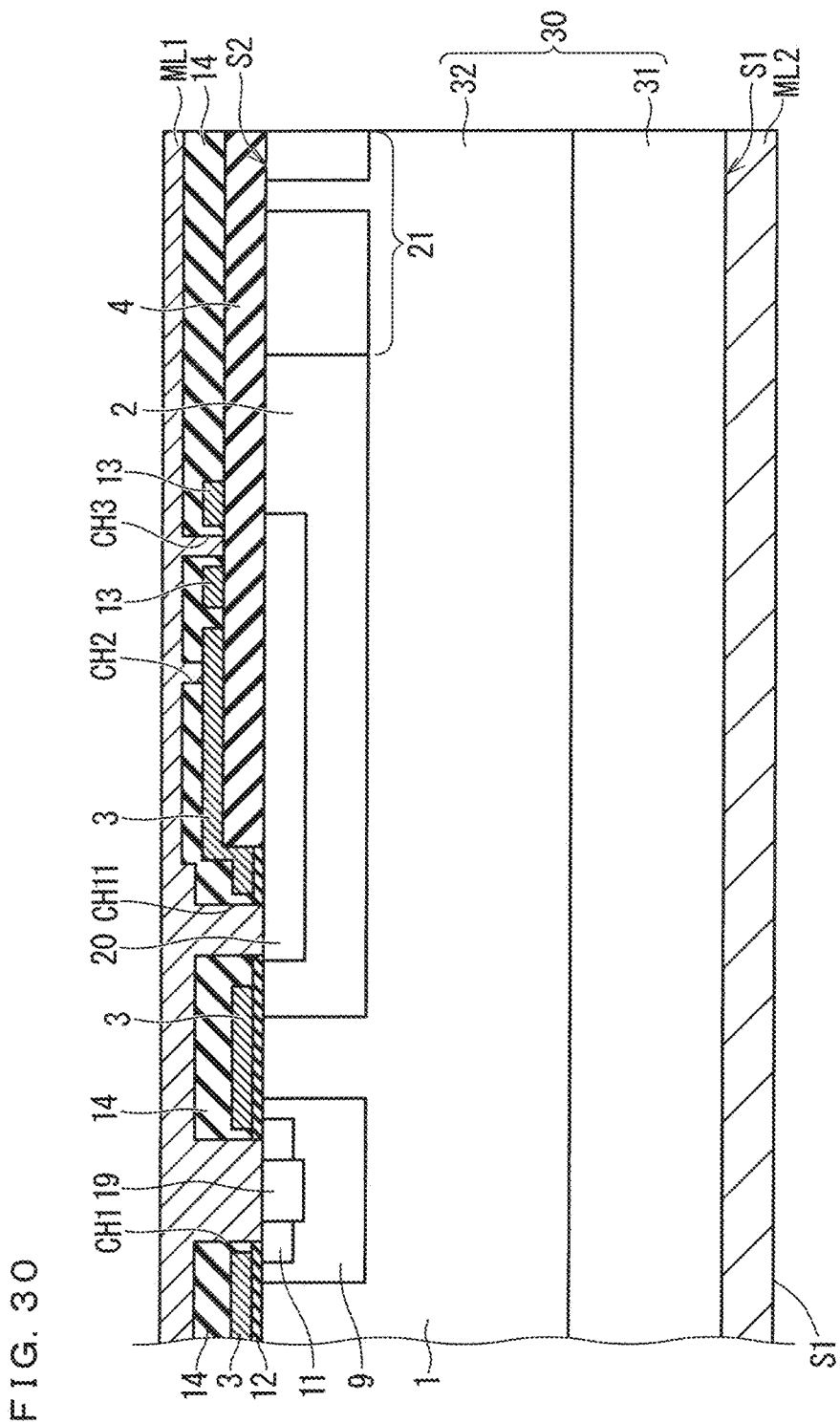
FIG. 30 is a partial cross-sectional diagram illustrating the manufacturing process of the semiconductor device according to the second embodiment of the present disclosure.

Further, in the process illustrated in FIG. 30, a material layer ML2 to be the back surface electrode 8 is formed on the lower surface Si of the epitaxial substrate 30, using a method similar to that for the material layer ML1.

Figure 31:
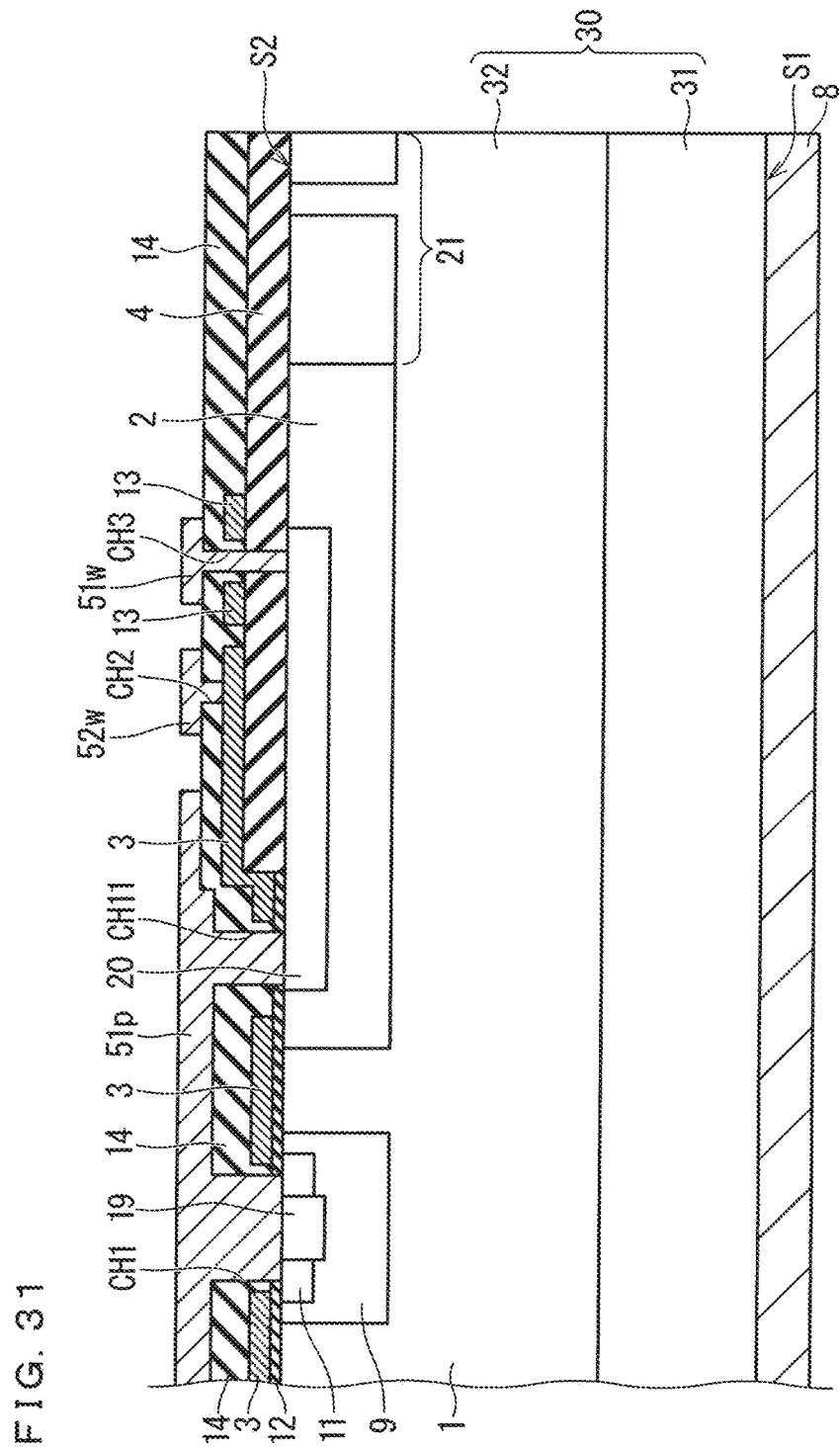
FIG. 31 is a partial cross-sectional diagram illustrating the manufacturing process of the semiconductor device according to the second embodiment of the present disclosure.

Next, in the process illustrated in FIG. 31, through a photolithography process and an etching process, the material layer ML1 is patterned to separate the source electrode 51 (including the source pad 51p and the source wire 51w) and the gate part 52 (including the gate pad 52p and the gate wire 52w), and the front surface electrode 50 is thereby formed.

In this case, as illustrated in the cross-sectional diagram of FIG. 20, the source wire 51w is formed such that the outer peripheral wire layer 13 is located below the outer peripheral end portion and the inner peripheral portion of the source wire 51w. Note that the outer peripheral wire layer 13 can be formed in not only the part of the line B-B of FIG. 20 but also in the entire region below the outer peripheral end portion and the inner peripheral end portion of the source wire 51w.

By employing such a configuration, deposition of an insulator at the outer peripheral end portion and the inner peripheral end portion of the source wire 51w can be reduced in the entire periphery of the termination region, cracks and peeling in the source wire 51w and the front surface protective film 6 can be reduced, and insulation reliability of the semiconductor device can thus be enhanced.

Lastly, the front surface protective film 6 is formed to cover the end portion of the front surface electrode 50 and at least a part of the epitaxial substrate 30 in the outer region RO. In this manner, the MOSFET 201 illustrated in FIG. 21 is obtained. Note that, if formation of the low concentration well region 21 is omitted in the process described with reference to FIG. 23, the MOSFET 200 illustrated in FIG. 20 is obtained.

As described above, according to the MOSFET 200 of the second embodiment, generation of aluminum hydroxide at the end portion of the source wire 51w in the termination region is reduced, and cracks or peeling in the source wire 51w and the front surface protective film 6 is reduced. As a result, increase of a leakage current and air discharge due to cracks or peeling in the source wire 51*w* and the front surface protective film 6 can be reduced, and insulation reliability of the MOSFET 200 can thus be enhanced.

<Other Examples of Materials for Semiconductor Substrate>

The semiconductor device according to the first and second embodiments described above illustrates an example in which SiC is used as a material for the epitaxial substrate 30. However, this is not restrictive, and other wide-bandgap semiconductors, such as gallium nitride (GaN), can also be used as the material for the epitaxial substrate 30.

Further, the MOSFET is illustrated as an example of the semiconductor device according to the first and second embodiments. However, this is not restrictive, and the present disclosure can also be applied to transistors other than the MOSFET, for example, a junction FET (JFET), an insulated gate bipolar transistor (IGBT), or the like.

<Other Examples of Transistors>

Further, a planar transistor is illustrated as an example of the MOSFET 100 according to the first embodiment and the MOSFET 200 according to the second embodiment. However, the present disclosure can also be applied to a trench transistor.

<Third Embodiment>

A power conversion device and a manufacturing method of the power conversion device according to a third embodiment will be described. In the third embodiment, the semiconductor device according to the first and second embodiments described above is applied to the power conversion device, and in the following description, constituent elements similar to the constituent elements described in the first and second embodiments are denoted by the same reference signs for illustration, and detailed description thereof will be omitted as appropriate.

<Configuration of Power Conversion Device>

Although the power conversion device to be applied is not limited to one with specific usage, the following will describe a case of application to a three-phase inverter.

Figure 32:
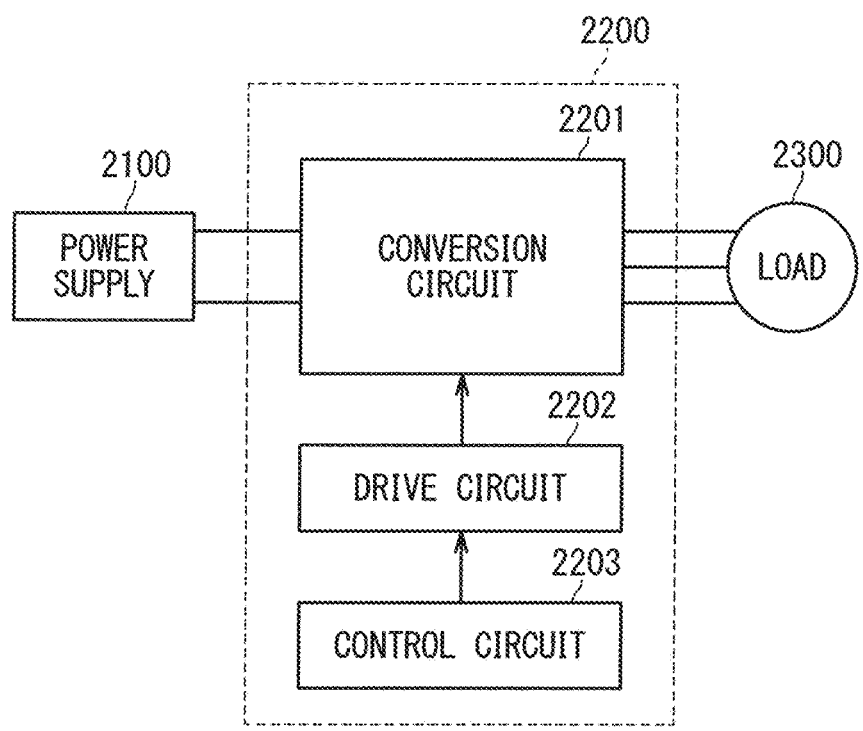
FIG. 32 is a block diagram illustrating a configuration of a power conversion system to which a power conversion device is applied according to a third embodiment of the present disclosure.

FIG. 32 is a block diagram schematically illustrating a configuration of a power conversion system including a power conversion device 2200 according to the third embodiment.

The power conversion system illustrated in FIG. 32 includes a power supply 2100, a power conversion device 2200, and a load 2300. The power supply 2100 is a DC power supply, and supplies DC power to the power conversion device 2200. The power supply 2100 can be configured with various objects, and can be configured with a DC system, a solar battery, a storage battery, or the like, for example. Alternatively, the power supply 2100 can be configured with a rectifier circuit or an AC-DC converter connected to an AC system. Alternatively, the power supply 2100 can be configured with a DC-DC converter that converts DC power output from a DC system into predetermined power.

The power conversion device 2200 is a three-phase inverter connected between the power supply 2100 and the load 2300. The power conversion device 2200 converts DC power supplied from the power supply 2100 to AC power, and supplies the AC power to the load 2300.

Further, as illustrated in FIG. 32, the power conversion device 2200 includes a conversion circuit 2201 that converts DC power into AC power and outputs the AC power, a drive circuit 2202 that outputs a drive signal for driving respective switching elements of the conversion circuit 2201, and a control circuit 2203 that outputs a control signal for controlling the drive circuit 2202 to the drive circuit 2202.

The load 2300 is a three-phase electric motor driven by the AC power supplied from the power conversion device 2200. Note that the load 2300 is not limited to one with specific usage, is an electric motor mounted on various electrical devices, and is used as an electric motor for a hybrid vehicle, an electric vehicle, a railroad vehicle, an elevator, or an air conditioner, for example.

Details of the power conversion device 2200 will be described. The conversion circuit 2201 includes switching elements and freewheeling diodes (not illustrated). With the switching elements performing switching operations, the DC power supplied from the power supply 2100 is converted into AC power, and is then supplied to the load 2300.

Although there are various specific circuit configurations of the conversion circuit 2201, the conversion circuit 2201 according to the third embodiment may be a two-level three-phase full-bridge circuit, which includes six switching elements and six freewheeling diodes connected in reverse parallel to their respective switching elements.

Any one of the semiconductor devices according to the first and second embodiments described above is applied to each of the switching elements in the conversion circuit 2201. The six switching elements are connected in series for every two switching elements to form upper and lower arms, and each of the upper and lower arms forms each phase (phase U, phase V, and phase W) of the full-bridge circuit. Output terminals of the upper and lower arms, that is, three output terminals of the conversion circuit 2201, are connected to the load 2300.

The drive circuit 2202 generates a drive signal for driving the switching elements of the conversion circuit 2201, and supplies the drive signal to control electrodes of the switching elements of the conversion circuit 2201. Specifically, the drive circuit 2202 outputs a drive signal for turning the switching elements into an on-state and a drive signal for turning the switching elements into an off-state to the control electrodes of respective switching elements, based on a control signal output from the control circuit 2203 to be described later.

When a switching element is to be maintained in the on-state, the drive signal is a voltage signal (on-signal) having a threshold voltage of the switching element or higher, whereas when the switching element is to be maintained in the off-state, the drive signal is a voltage signal (off-signal) having less than the threshold voltage of the switching element.

The control circuit 2203 controls the switching elements of the conversion circuit 2201 so that desired power is supplied to the load 2300. Specifically, the control circuit 2203 calculates time (on-time) at which each of the switching elements of the conversion circuit 2201 is to be turned into the on-state, based on power to be supplied to the load 2300. For example, the conversion circuit 2201 can be controlled with use of pulse width modulation (PWM) control for modulating the on-time of each switching element according to a voltage to be output.

The control circuit 2203 outputs a control command (control signal) to the drive circuit 2202 so that the on-signal is output to the switching element to be turned into the on-state and the off-signal is output to the switching element to be turned into the off-state at respective time points. The drive circuit 2202 outputs the on-signal or the off-signal as the drive signal to the control electrode of each switching element, based on the control signal.

In the power conversion device 2200 according to the third embodiment, any one of the semiconductor devices according to the first and second embodiments described above is applied as the switching elements of the conversion circuit 2201, and therefore on-resistance after an energization cycle can be stabilized.

When the semiconductor device according to the first and second embodiments is applied to the power conversion device 2200 as described above, the semiconductor device is usually used being embedded in gel, resin, or the like. Since these materials cannot even completely shut off moisture, the configurations described in the first and second embodiments maintain insulation protection of the semiconductor device. In other words, when the semiconductor device having the configurations described in the first and second embodiments is applied, reliability of the power conversion device 2200 can be enhanced.

Note that the third embodiment describes an example in which the semiconductor device according to the first and second embodiments is applied to the two-level three-phase inverter. However, an application example of the semiconductor device according to the first and second embodiments is not limited thereto, and the semiconductor device according to the first and second embodiments can be applied to various power conversion devices.

Further, the third embodiment describes the two-level power conversion device. However, the semiconductor device according to the first and second embodiments can be applied to a three-level or multi-level power conversion device. Further, when power is supplied to a single-phase load, the semiconductor device according to the first and second embodiments can be applied to a single-phase inverter.

Further, when power is supplied to a DC load or the like, the semiconductor device according to the first and second embodiments can also be applied to a DC-DC converter or an AC-DC converter.

Further, the power conversion device to which the semiconductor device according to the first and second embodiments is applied is not limited to the above-described case in which an electric motor is used as a load, and can also be used as a power supply device of an electric discharge machine, a laser machine, an induction heating cooking device, or a non-contact power supply system, for example. Further, the power conversion device to which the semiconductor device according to the first and second embodiments is applied can also be used as a power conditioner in a photovoltaic system, a power storage system, or the like.

<Manufacturing Method of Power Conversion Device>

Next, a manufacturing method of the power conversion device according to the third embodiment will be described. First, the semiconductor device is manufactured using the manufacturing method described in the first and second embodiments. Then, the conversion circuit 2201 including the semiconductor device is incorporated into the power conversion device 2200. The conversion circuit 2201 is a circuit for converting input power and outputting converted power.

Then, the drive circuit 2202 is incorporated into the power conversion device 2200. The drive circuit 2202 is a circuit for outputting a drive signal for driving the semiconductor device to the semiconductor device. Then, the control circuit 2203 is incorporated into the power conversion device 2200. The control circuit 2203 is a circuit for outputting a control signal for controlling the drive circuit 2202 to the drive circuit 2202.

An example is illustrated in which the semiconductor device described in the first and second embodiments, that is, a semiconductor switching element, is made of a SiC semiconductor. However, a switching element made of a wide-bandgap semiconductor other than the SiC semiconductor may be used.

Examples of wide-bandgap semiconductors being non-Si semiconductors include a gallium nitride-based material and diamond, other than silicon carbide. The switching element made of a wide-bandgap semiconductor can be used even in a high voltage region, where a Si semiconductor has difficulty in unipolar operation, and can thus significantly reduce switching loss generated at the time of switching operation. This enables significant reduction of power loss.

Further, the switching element made of a wide-bandgap semiconductor has small power loss and also has high thermal resistance. Accordingly, when a power module including a cooling unit is configured, radiation fins of a heat sink can be downsized, and thus a semiconductor module can be further downsized.

Further, the switching element made of a wide-bandgap semiconductor is suited for high-frequency switching operation. Accordingly, in a case of application to a converter circuit greatly required for usage in higher frequencies, a reactor, a capacitor, and the like connected to the converter circuit can also be downsized owing to the usage in higher switching frequencies.

While each of the embodiments described above may describe a physical property, a material, a dimension, a shape, a relative relationship in disposition, a condition for implementation, or the like of each constituent element, these are in all aspects illustrative and not restrictive. Therefore, numerous unillustrated modifications and variations are devised within the scope of the disclosure.

For example, the above cases are encompassed where any constituent element is modified, added, or omitted, and at least one constituent element in at least one embodiment is extracted and combined with a constituent element of another embodiment.

Further, unless inconsistency arises, a constituent element described as being provided "one" in number in each of the embodiments described above may be "one or more" in number. Further, each constituent element constituting the present disclosure is a conceptual unit. One constituent element may include a plurality of structures, and one constituent element may correspond to a part of a certain structure. Further, each constituent element of the present disclosure includes a structure having another configuration or shape as long as the structure exerts the same function.

Note that, in the present disclosure, each of the embodiments can be freely combined and each of the embodiments can be modified or omitted as appropriate within the scope of the disclosure.

While the disclosure has been shown and described in detail, the foregoing description is in all aspects illustrative and not restrictive. It is therefore understood that numerous unillustrated modifications and variations can be devised without departing from the scope of the disclosure. Further, description in this specification is referred to for all purposes of the present disclosure, and is not admitted to be prior art unless otherwise noted.

The invention claimed is:

1. A semiconductor device including an active region in which a main current flows in a thickness direction of a semiconductor substrate, wherein
    the semiconductor substrate is divided into an inner region in which the active region is provided and an outer region surrounding the inner region, the semiconductor device includes
a semiconductor layer of a first conductivity type,
a termination well region of a second conductivity type being a conductivity type different from the first conductivity type, the termination well region being selectively provided in an upper layer portion of the semiconductor layer to surround the inner region in plan view,
an impurity region of the first or second conductivity type, the impurity region being selectively provided in an upper layer portion of the termination well region,
a front surface electrode being provided on a side of a second main surface of the semiconductor substrate, the second main surface being opposite to a first main surface of the semiconductor substrate,
a back surface electrode being provided on the first main surface,
an insulation film being provided to partially cover a top of the termination well region,
an outer peripheral wire layer surrounding the inner region in the plan view, at least a part of the outer peripheral wire layer being provided on the insulation film, and
an interlayer insulation film at least covering the insulation film and the outer peripheral wire layer,
the termination well region extends from a boundary between the inner region and the outer region to the outer region,
the front surface electrode is provided from the inner region to a top of the interlayer insulation film, and is connected to the impurity region through a first contact hole passing through the interlayer insulation film to reach the impurity region,
the outer peripheral wire layer is provided to be separated away from the gate electrode provided in the inner region and led out to the outer region, and the outer peripheral wire layer is provided so that an outer peripheral end portion of
the outer peripheral wire layer on an outer peripheral side being opposite to the inner region in the plan view is located on an inner peripheral side with respect to an outer peripheral end portion of the termination well region being opposite to the inner region in the plan view, and is located on an outer side with respect to a position below an end portion of the front surface electrode on the interlayer insulation film.

2. The semiconductor device according to claim 1, wherein
the outer peripheral wire layer is provided so that the outer peripheral end portion of the outer peripheral wire layer is located on the outer side with respect to the position below the end portion of the front surface electrode on the interlayer insulation film in entire periphery surrounding the inner region.

3. The semiconductor device according to claim 1, wherein
the outer peripheral wire layer is provided so that the outer peripheral end portion of the outer peripheral wire layer is located at least 1 um on the outer side with respect to the position below the end portion of the front surface electrode on the interlayer insulation film.

4. The semiconductor device according to claim 1, wherein
the front surface electrode is connected to the outer peripheral wire layer through a second contact hole passing through the interlayer insulation film to reach the outer peripheral wire layer.

5. The semiconductor device according to claim 4, wherein
the front surface electrode is connected to the outer peripheral wire layer through the second contact hole at the end portion on the interlayer insulation film.

6. A semiconductor device including an active region in which a main current flows in a thickness direction of a semiconductor substrate, wherein
the semiconductor substrate is divided into an inner region in which the active region is provided and an outer region surrounding the inner region,
the semiconductor device includes
a semiconductor layer of a first conductivity type,
a termination well region of a second conductivity type being a conductivity type different from the first conductivity type, the termination well region being selectively provided in an upper layer portion of the semiconductor layer to surround the inner region in plan view,
an impurity region of the first or second conductivity type, the impurity region being selectively provided in an upper layer portion of the termination well region, a front surface electrode being provided on a side of a second main surface of the semiconductor substrate, the second main surface being opposite to a first main surface of the semiconductor substrate,
a back surface electrode being provided on the first main surface,
an insulation film being provided to partially cover a top of the termination well region,
an outer peripheral wire layer, at least a part of the outer peripheral wire layer being provided on the insulation film, and
an interlayer insulation film at least covering the insulation film and the outer peripheral wire layer,
the termination well region extends from a boundary between the inner region and the outer region to the outer region,
the inner region includes a minimum unit structure for a transistor, the inner region including a plurality of the minimum unit structures to form the active region,
the front surface electrode includes
a gate part electrically connected to a gate electrode of the transistor, and
a source electrode electrically connected to a source region electrode of the transistor,
at least a part of the gate electrode is provided on the insulation film,
the source electrode includes a source pad and a source wire connected to the source pad, the source pad being provided from the inner region to a top of the interlayer insulation film and connected to the impurity region through a first contact hole passing through the interlayer insulation film to reach the impurity region,
the gate part includes a gate wire and a gate pad connected to the gate wire, the gate wire being separated away from the source pad, being provided on the interlayer insulation film to surround the source pad in the plan view, and being connected to the gate electrode through a second contact hole passing through the interlayer insulation film to reach the gate electrode on the insulation film,
the source wire is separated away from the gate wire, and is provided on the interlayer insulation film to surround the gate wire in the plan view, the outer peripheral wire layer is provided on the insulation film to surround the gate electrode in the plan view, and the outer peripheral wire layer is provided so that an outer peripheral end portion of the outer peripheral wire layer on an outer peripheral side being opposite to the inner region is located on an inner peripheral side with respect to an outer peripheral end portion of the termination well region being opposite to the inner region in the plan view, is located on an outer side with respect to a position below an outer peripheral end portion of the source wire, and is located on an inner side with respect to a position below an inner peripheral end portion of the source wire.

7. The semiconductor device according to claim 6, wherein
the outer peripheral wire layer is provided so that the outer peripheral end portion of the outer peripheral wire layer is located on the outer side with respect to the position below the outer peripheral end portion of the source wire and is located on the inner side with respect to the position below the inner peripheral end portion of the source wire in entire periphery surrounding the gate electrode.

8. The semiconductor device according to claim 6, wherein
the outer peripheral wire layer is provided so that the outer peripheral end portion of the outer peripheral wire layer is located at least 1 um on the outer side with respect to the position below the outer peripheral end portion of the source wire and is located at least 1 μm on the inner side with respect to the position below the inner peripheral end portion of the source wire.

9. The semiconductor device according to claim 6, wherein
the source wire is connected to the outer peripheral wire layer through a third contact hole passing through the interlayer insulation film to reach the outer peripheral wire layer.

10. The semiconductor device according to claim 9, wherein the source wire is connected to the outer peripheral wire layer through the third contact hole at the outer peripheral end portion of the source wire.

11. The semiconductor device according to claim 9, wherein
the source wire is connected to the outer peripheral wire layer through the third contact hole at the inner peripheral end portion of the source wire.

12. The semiconductor device according to claim 1, wherein
the semiconductor layer is a silicon carbide semiconductor layer.

13. The semiconductor device according to claim 6, wherein
the semiconductor layer is a silicon carbide semiconductor layer.

14. The semiconductor device according to claim 1, wherein
the interlayer insulation film has elemental composition of boron or phosphorus.

15. The semiconductor device according to claim 6, wherein
the interlayer insulation film has elemental composition of boron or phosphorus.

16. The semiconductor device according to claim 1, wherein
impurity concentration of the termination well region per unit area is $2\times10^{13}$ cm$^{-2}$ or more.

17. The semiconductor device according to claim 6, wherein
impurity concentration of the termination well region per unit area is $2\times10^{13}$ cm$^{-2}$ or more.

18. The semiconductor device according to claim 1, wherein
the semiconductor substrate includes a well region of the second conductivity type, the well region being selectively provided in the upper layer portion of the semiconductor layer, and
the well region has impurity concentration equal to or lower than impurity concentration of the termination well region.

19. The semiconductor device according to claim 6, wherein
the semiconductor substrate includes a well region of the second conductivity type, the well region being selectively provided in the upper layer portion of the semiconductor layer, and
the well region has impurity concentration equal to or lower than impurity concentration of the termination well region.

20. A power conversion device comprising:
a conversion circuit configured to convert input power and output converted power, the conversion circuit including the semiconductor device according to claim 1;
a drive circuit configured to output a drive signal for driving the semiconductor device to the semiconductor device; and
a control circuit configured to output a control signal for controlling the drive circuit to the drive circuit.

21. A power conversion device comprising:
a conversion circuit configured to convert input power and output converted power, the conversion circuit including the semiconductor device according to claim 6;
a drive circuit configured to output a drive signal for driving the semiconductor device to the semiconductor device; and
a control circuit configured to output a control signal for controlling the drive circuit to the drive circuit.

* * * * *